US012803503B2

(12) United States Patent
Tahara et al.

(10) Patent No.: US 12,803,503 B2
(45) Date of Patent: Nov. 17, 2026

(54) HIGH-FREQUENCY MODULE AND COMMUNICATION DEVICE

(71) Applicant: Murata Manufacturing Co., Ltd., Nagaokakyo (JP)

(72) Inventors: Kenji Tahara, Nagaokakyo (JP); Yuuki Nakano, Nagaokakyo (JP); Kae Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 247 days.

(21) Appl. No.: 18/823,707

(22) Filed: Sep. 4, 2024

(65) Prior Publication Data

US 2024/0429871 A1 Dec. 26, 2024

Related U.S. Application Data

(63) Continuation of application No. PCT/JP2023/006213, filed on Feb. 21, 2023.

(30) Foreign Application Priority Data

Mar. 10, 2022 (JP) ................................. 2022-037434

(51) Int. Cl.
*H03F 1/02* (2006.01)
*H03F 3/24* (2006.01)
*H04B 1/04* (2006.01)

(52) U.S. Cl.
CPC ........... *H03F 1/0288* (2013.01); *H03F 3/245* (2013.01); *H03F 2200/171* (2013.01); *H03F 2200/451* (2013.01); *H04B 1/04* (2013.01)

(58) Field of Classification Search
CPC .... H03F 2200/451; H03F 3/195; H03F 3/245; H03F 1/0288; H03F 1/02; H03F 3/24; H03F 2200/171; H04B 1/04
See application file for complete search history.

(56) References Cited

U.S. PATENT DOCUMENTS 9,853,605 B2 * 12/2017 Shiikuma .............. H03F 1/0288
2014/0152389 A1 * 6/2014 Hamparian ........... H03F 1/0288
330/295

FOREIGN PATENT DOCUMENTS

CN 108768308 A 11/2018
JP 2008-160505 A 7/2008
WO 2015/114698 A1 8/2015

OTHER PUBLICATIONS

International Search Report and Written Opinion mailed on May 16, 2023, received for PCT Application PCT/JP2023/006213, filed on Feb. 21, 2023, 9 pages including English Translation.

* cited by examiner

*Primary Examiner* — Tuan H Nguyen
(74) *Attorney, Agent, or Firm* — XSENSUS LLP

(57) ABSTRACT

A high-frequency module is disclosed, comprising a carrier amplifier, peak amplifiers, a transformer, a phase-shifting line, and bias circuits, all integrated into a semiconductor IC. The input terminals of the semiconductor IC are connected to the input ends of both the carrier and peak amplifiers, while the output terminals are connected to their respective output ends. The transformer has one end connected to the output terminal, with the other end connected to the output terminal via the phase-shifting line. Additionally, the bias circuits are connected to the carrier amplifier and the peak amplifiers to regulate their operation.

20 Claims, 10 Drawing Sheets

WHEN LARGE SIGNAL IS INPUT

WHEN MEDIUM SIGNAL IS INPUT

WHEN SMALL SIGNAL IS INPUT

HIGH-FREQUENCY MODULE AND COMMUNICATION DEVICE

CROSS-REFERENCE TO RELATED APPLICATIONS

The present application is a continuation application of PCT International Application No. PCT/JP2023/006213 filed on Feb. 21, 2023, designating the United States of America, which is based on and claims priority to Japanese patent application JP 2022-037434, filed Mar. 10, 2022. The entire disclosures of the above-identified applications, including the specifications, the drawings, and the claims are incorporated herein by reference in their entirety.

TECHNICAL FIELD

The present disclosure relates to a high-frequency module and a communication device.

BACKGROUND

As is commonly known, a high-frequency circuit (power amplifier circuit) including a first amplifier (carrier amplifier) that amplifies a first signal, which is distributed from an input signal in a region where a power level of the input signal is equal to or higher than a first level, to output a second signal, a first transformer to which the second signal is input, a second amplifier (peak amplifier) that amplifies a third signal, which is distributed from an input signal in a region where a power level of the input signal is equal to or higher than a second level, the second level being higher than the first level, to output a fourth signal, and a second transformer to which the fourth signal is input.

SUMMARY

Technical Problem

However, in a case of a prior high-frequency circuit, there is a case where an amount of back-off, which is the power difference from a high-output region where the first amplifier and the second amplifier are in an on state to a low-output region where only the first amplifier is in an on state, and an efficiency are not sufficient. In addition, in a case of securing the amount of back-off and the efficiency, the circuit is increased in size.

The present disclosure has been made to solve the above-described problems, and an object thereof is to provide a high-frequency module and a communication device in which an amount of back-off and an efficiency are improved while an increase in size is suppressed.

Solution to Problem

A high-frequency module according to an aspect of the present disclosure includes: a first amplifier element, a second amplifier element, and a third amplifier element, a transformer that includes an input-side coil and an output-side coil, a phase shifting circuit, and a first bias circuit and a second bias circuit that supply a bias current, in which the first amplifier element, the second amplifier element, and the third amplifier element are included in a semiconductor integrated circuit component, on a surface of the semiconductor integrated circuit component, a first input terminal and a second input terminal for the semiconductor integrated circuit component to receive a high-frequency signal, and a first output terminal and a second output terminal for the semiconductor integrated circuit component to output the high-frequency signal are disposed, an input end of the first amplifier element and an input end of the second amplifier element are connected to the first input terminal, an output end of the first amplifier element and an output end of the second amplifier element are connected to the first output terminal, an input end of the third amplifier element is connected to the second input terminal, an output end of the third amplifier element is connected to the second output terminal, one end of the input-side coil is connected to the first output terminal, one end of the phase shifting circuit is connected to the second output terminal, another end of the phase shifting circuit is connected to another end of the input-side coil, the first bias circuit is connected to the first amplifier element, and the second bias circuit is connected to the second amplifier element and the third amplifier element.

In addition, a high-frequency module according to an aspect of the present disclosure includes: a first amplifier element, a second amplifier element, and a third amplifier element, a phase shifting circuit, and a first bias circuit and a second bias circuit that supply a bias current, in which the first amplifier element, the second amplifier element, and the third amplifier element are included in a semiconductor integrated circuit component, on a surface of the semiconductor integrated circuit component, a first input terminal and a second input terminal for the semiconductor integrated circuit component to receive a high-frequency signal, and a first output terminal and a second output terminal for the semiconductor integrated circuit component to output a high-frequency signal are disposed, an input end of the first amplifier element and an input end of the second amplifier element are connected to the first input terminal, an output end of the first amplifier element and an output end of the second amplifier element are connected to the first output terminal, an input end of the third amplifier element is connected to the second input terminal, an output end of the third amplifier element is connected to the second output terminal, one end of the phase shifting circuit is connected to the first output terminal, another end of the phase shifting circuit is connected to the second output terminal, the first bias circuit is connected to the first amplifier element, and the second bias circuit is connected to the second amplifier element and the third amplifier element.

Advantageous Effects

According to the present disclosure, it is possible to provide a high-frequency module and a communication device in which an improvement in the amount of back-off and an improvement in efficiency are achieved while an increase in size is suppressed.

DETAILED DESCRIPTION

Figure 1:
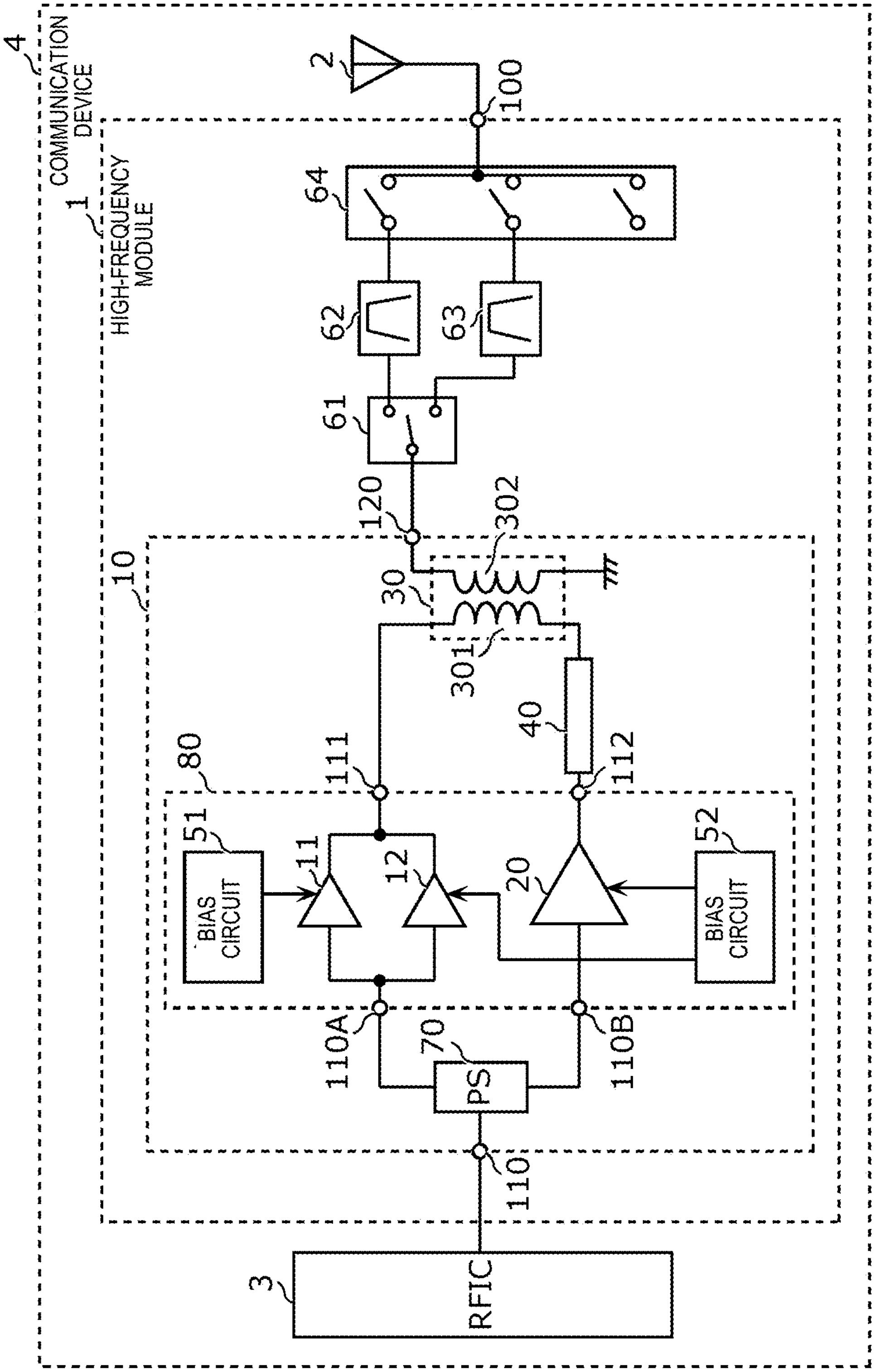
FIG. 1 is a circuit configuration diagram of a high-frequency module and a communication device according to an exemplary embodiment.

Exemplary embodiments of the present disclosure will be described in detail below. It should be noted that all of the exemplary embodiments described below describe comprehensive or specific examples. Numerical values, shapes, materials, constituent elements, the arrangement and connection configuration of the constituent elements, and so forth that are described in the following exemplary embodiments are merely examples and are not intended to limit the present disclosure. Of constituent elements in the following example and modification example, a constituent element not described in an independent claim is described as an optional constituent element. In addition, sizes or size ratios of the constituent elements shown in drawings are not necessarily exact. In the figures, constituent components that are substantially the same are denoted by the same reference numerals, and a repeated description thereof is omitted or simplified in some cases.

Furthermore, in the following description, terms, such as "parallel" and "perpendicular", representing a relationship between elements, a term, such as "rectangular", representing the shape of an element, and a numerical range refer to not only their exact meaning but also a substantially equivalent range, for example, the inclusion of a difference of about a few percent.

In each of the following drawings, an x-axis and a y-axis are axes orthogonal to each other on a plane parallel to a main surface of a semiconductor integrated circuit component. Specifically, in a case where a semiconductor integrated circuit component has a rectangular shape in a plan view, the x-axis is parallel to a first side of the semiconductor integrated circuit component, and the y-axis is parallel to a second side orthogonal to the first side of the semiconductor integrated circuit component. In addition, a z-axis is an axis perpendicular to the main surface of the semiconductor integrated circuit component, and the positive direction thereof indicates an upward direction and the negative direction thereof indicates a downward direction.

In the circuit configuration of the present disclosure, the expression "connected" includes not only a case of being directly connected by a connection terminal and/or a wiring conductor, but also a case of being electrically connected with another circuit element interposed therebetween. The expression "connected between A and B" means "connected to both A and B between A and B", and in addition to "connected in series to a path that connects A and B to each other, the expression includes a parallel connection (shunt connection) between the path and the ground.

In the component disposition of the present disclosure, the expression "in a case where the main surface of a semiconductor integrated circuit component is viewed in a plan view" means that an object is projected in a positive direction from a z-axis positive side to an xy plane. The expression "A is disposed between B and C" means that at least one of a plurality of line segments connecting any point in B and any point in C passes through A. Furthermore, terms such as "parallel" and "perpendicular", representing a relationship between elements, a term such as "rectangular" representing the shape of the element, and a numerical value range mean not only their exact meaning but also a substantially equivalent range, for example, the inclusion of an error of about a few percent.

In addition, in the component disposition of the present disclosure, the expression "a component A is disposed in a semiconductor integrated circuit component" includes a case where the component A is disposed on the main surface of the semiconductor integrated circuit component and a case where the component A is disposed in the semiconductor integrated circuit component. The expression "the component A or a terminal is disposed on the surface of the semiconductor integrated circuit component" includes a case where the component A or the terminal is laminated on another component that is disposed in contact with the main surface without being in contact with the main surface, in addition to a case where the component A is disposed in contact with the surface of the semiconductor integrated circuit component. In addition, the expression "the component A or the terminal is disposed on the surface of the semiconductor integrated circuit component" may include a case where the component A is disposed in the recess portion formed on the surface. The expression "the component A is included in the semiconductor integrated circuit component" includes a case where the entire component A is disposed between both main surfaces of the semiconductor integrated circuit component and a part of the component A is not covered with the semiconductor integrated circuit component in addition to a case where the component A is encapsulated in the semiconductor integrated circuit component, and a case where only a part of the component A is disposed in the semiconductor integrated circuit component.

In addition, in the present disclosure, the term "signal path" means a transmission line configured with a wire through which a high-frequency signal propagates, an electrode directly connected to the wire, a terminal directly connected to the wire or to the electrode, and the like.

Exemplary Embodiment

[1. Circuit Configuration of High-Frequency Module 1 and Communication Device 4]

The circuit configuration of a high-frequency module 1 and a communication device 4 according to the present exemplary embodiment will be described with reference to FIG. 1. FIG. 1 is a circuit configuration diagram of the high-frequency module 1 and the communication device 4 according to an exemplary embodiment.

[1.1 Circuit Configuration of Communication Device 4]

First, a circuit configuration of the communication device 4 will be described. As shown in FIG. 1, the communication device 4 according to the present exemplary embodiment includes a high-frequency module 1, an antenna 2, and an RF signal processing circuit (RFIC) 3.

The high-frequency module 1 transmits a high-frequency signal between the antenna 2 and the RFIC 3. A detailed circuit configuration of the high-frequency module 1 will be described later.

The antenna 2 is connected to an antenna connection terminal 100 of the high-frequency module 1, transmits a high-frequency signal output from the high-frequency module 1, and receives a high-frequency signal from the outside and outputs the high-frequency signal to the high-frequency module 1.

The RFIC 3 is an example of a signal processing circuit that processes a high-frequency signal. Specifically, the RFIC 3 performs signal processing on a reception signal input through a reception path of the high-frequency module 1 by down-converting or the like, and outputs the reception signal generated through the signal processing to a baseband signal processing circuit (BBIC). In addition, the RFIC 3 performs signal processing on a transmission signal input from the BBIC by up-converting or the like, and outputs the transmission signal generated through the signal processing to a transmission path of the high-frequency module 1. In addition, the RFIC 3 includes a control unit that controls a switch, an amplifier element, a bias circuit, and the like included in the high-frequency module 1. A part or all of functions as the control unit of the RFIC 3 may be installed outside the RFIC 3, for example, may be installed on the BBIC or the high-frequency module 1.

In addition, the RFIC 3 also has a function as a control unit that controls a power supply voltage and a bias current (or a bias voltage) supplied to each amplifier of the high-frequency module 1. Specifically, the RFIC 3 outputs a digital control signal to the high-frequency module 1. A power supply voltage and a bias current (or a bias voltage) controlled by the digital control signal are supplied to each amplifier of the high-frequency module 1.

In addition, the RFIC 3 also has a function as a control unit that controls the connection of switches 61 and 64 included in the high-frequency module 1 based on a communication band (frequency band) to be used.

In the communication device 4 according to the present exemplary embodiment, the antenna 2 is not an essential component.

[1.2 Circuit Configuration of High-Frequency Module 1]

Next, a circuit configuration of the high-frequency module 1 will be described. As shown in FIG. 1, the high-frequency module 1 includes an amplifier circuit 10, filters 62 and 63, the switches 61 and 64, and the antenna connection terminal 100.

The amplifier circuit 10 is a Doherty-type amplifier circuit that amplifies the transmission signals of a band A and a band B input from a signal input terminal 110. The high-frequency module 1 may include a Doherty-type first amplifier circuit that amplifies the high-frequency signal of the band A and a Doherty-type second amplifier circuit that amplifies the high-frequency signal of the band B, instead of the amplifier circuit 10.

The Doherty amplifier circuit means an amplifier circuit that realizes high efficiency by using a plurality of amplifier elements as a carrier amplifier and a peak amplifier. The carrier amplifier refers to an amplifier element that is operated even when the power of a high-frequency signal (input) is low or high in a Doherty-type amplifier circuit. The peak amplifier refers to an amplifier element that is mainly operated when the power of a high-frequency signal (input) is high in a Doherty-type amplifier circuit. Therefore, when the input power of a high-frequency signal is low, the high-frequency signal is mainly amplified by the carrier amplifier, and when the input power of the high-frequency signal is high, the high-frequency signal is amplified by the carrier amplifier and the peak amplifier and synthesized. Due to such an operation, in a Doherty-type amplifier circuit, a load impedance viewed from the carrier amplifier increases at low output power, and the efficiency at low output power is improved.

In the high-frequency module according to the present disclosure, in a case where the output signal of the carrier amplifier and the output signal of the peak amplifier are voltage-synthesized, a phase shifting circuit that shifts the phase of the high-frequency signal by ¼ wavelength is not connected to the output terminal of a circuit in which a carrier amplifier 11 and a peak amplifier 12 are connected in parallel. On the other hand, a phase shifting circuit that shifts the phase of the high-frequency signal by ¼ wavelength is connected to the output terminal of a peak amplifier 20. In addition, in the high-frequency module according to the present disclosure, in a case where the output signal of the carrier amplifier and the output signal of the peak amplifier are current-synthesized, a phase shifting circuit that shifts the phase of the high-frequency signal by ¼ wavelength is connected to the output terminal of a circuit in which the carrier amplifier 11 and the peak amplifier 12 are connected in parallel. On the other hand, a phase shifting circuit that shifts the phase of the high-frequency signal by ¼ wavelength is not connected to the output terminal of the peak amplifier 20.

In the present exemplary embodiment, each of the band A and the band B means a frequency band defined in advance by a standardization organization or the like (for example, 3rd Generation Partnership Project (3GPP) (registered trademark), Institute of Electrical and Electronics Engineers (IEEE)), for a communication system constructed by using a radio access technology (RAT). In the present exemplary embodiment, as a communication system, for example, a 4th Generation (4G)—Long Term Evolution (LTE) system, a 5th Generation (5G)—New Radio (NR) system, a wireless local area network (WLAN) system, or the like can be used, but the present disclosure is not limited thereto.

The filter 62 is connected between the switches 61 and 64 and passes the transmission signal in the transmission band of the band A among the transmission signals amplified by the amplifier circuit 10. In addition, the filter 63 is connected between the switches 61 and 64, and passes the transmission signal in the transmission band of the band B among the transmission signals amplified by the amplifier circuit 10.

Each of the filters 62 and 63 may be configured as a duplexer together with a receiving filter, or may be one filter that transmits a signal that transmits in a time division duplex (TDD) format. In a case where the filters 62 and 63 are filters for TDD, a switch for switching between transmission and reception is disposed in at least one of a proceeding stage or a subsequent stage of one filter.

The switch 61 includes a common terminal, a first selection terminal, and a second selection terminal. The common terminal is connected to the amplifier circuit 10. The first selection terminal is connected to the filter 62, and the second selection terminal is connected to the filter 63. In this connection configuration, the switch 61 switches the connection between the amplifier circuit 10 and the filter 62 and the connection between the amplifier circuit 10 and the filter 63.

The switch 64 is an example of an antenna switch, is connected to the antenna connection terminal 100, switches between connection and non-connection between the antenna connection terminal 100 and the filter 63, and switches between connection and non-connection between the antenna connection terminal 100 and the filter 62.

The high-frequency module 1 may include a receiver circuit for transmitting the reception signal received from the antenna 2 to the RFIC 3. In this case, the high-frequency module 1 includes a low noise amplifier and a receiving filter.

In addition, an impedance matching circuit may be disposed between the amplifier circuit 10 and the antenna connection terminal 100.

According to the circuit configuration, the high-frequency module 1 can transmit or receive any one of the high-frequency signals of the band A and the band B. Further, the high-frequency module 1 can execute at least any of simultaneous transmission, simultaneous reception, or simultaneous transmission and reception of the high-frequency signals of the band A and the band B.

The high-frequency module 1 according to the present disclosure may include at least the amplifier circuit 10 in the circuit configuration shown in FIG. 1.

Here, a circuit configuration of the amplifier circuit 10 will be described in detail.

As shown in FIG. 1, the amplifier circuit 10 includes the signal input terminal 110 and a signal output terminal 120, the carrier amplifier 11, the peak amplifiers 12 and 20, the phase shifting line 40, a phase shifting circuit 70, a transformer 30, and bias circuits 51 and 52.

The signal input terminal 110 is connected to the RFIC 3. The signal output terminal 120 is connected to the antenna connection terminal 100 via the switches 61 and 64 and the filters 62 and 63. Each of the signal input terminal 110, the signal output terminal 120, and the antenna connection terminal 100 may be a metal conductor such as a metal electrode and a metal bump, or may be one point on a metal wiring.

The carrier amplifier 11 is an example of a first amplifier element and amplifies a high-frequency signal of the band A or the band B input to the carrier amplifier 11. The carrier amplifier 11 is, for example, an A-class (or AB-class) amplifier circuit that can perform an amplification operation with respect to all power levels of signals input to the carrier amplifier 11, and particularly, can perform amplification operation with high efficiency in a low-output region and a medium-output region.

The peak amplifier 12 is an example of a second amplifier element and amplifies a high-frequency signal of the band A or the band B input to the peak amplifier 12. The peak amplifier 12 is, for example, a C-class amplifier circuit that can perform an amplification operation in a region where the power level of the signal input to the peak amplifier 12 is high. A second bias current smaller than a first bias current applied to the amplifier transistor of the carrier amplifier 11 may be applied to the amplifier transistor of the peak amplifier 12. Therefore, as the power level of the signal input to the peak amplifier 12 is higher, the output impedance is lower. As a result, the peak amplifier 12 can perform an amplification operation with low distortion in the high-output region.

The peak amplifier 20 is an example of a third amplifier element and amplifies a high-frequency signal of the band A or the band B input to the peak amplifier 20. The peak amplifier 20 is, for example, a C-class amplifier circuit that can perform an amplification operation in a region where the power level of the signal input to the peak amplifier 20 is high. The amplifier transistor included in the peak amplifier 20 may be applied with a third bias current smaller than the first bias current applied to the amplifier transistor included in the carrier amplifier 11. Therefore, as the power level of the signal input to the peak amplifier 20 is higher, the output impedance is lower. As a result, the peak amplifier 20 can perform an amplification operation with low distortion in the high-output region.

The carrier amplifier 11, the peak amplifier 12, and the peak amplifier 20 include an amplifier transistor. The amplifier transistor is, for example, a bipolar transistor such as a heterojunction bipolar transistor (HBT) or a field effect transistor such as a metal-oxide-semiconductor field effect transistor (MOSFET).

The transformer 30 includes an input-side coil 301 and an output-side coil 302.

A phase shifting line 40 is an example of a phase shifting circuit, and is, for example, a ¼ wavelength transmission line. The phase shifting line 40 delays a phase of the high-frequency signal input from one end thereof by ¼ wavelength and outputs the delayed signal from the other end. The phase shifting line 40 (phase shifting circuit) need not have a form of a phase shifting line, and may be, for example, a circuit configured with a chip-shaped inductor and a capacitor. More specifically, the phase shifting line 40 (phase shifting circuit) may be an LC circuit having two inductors connected in series to each other and a capacitor connected between a connection point of the two inductors and ground. In addition, the phase shifting line 40 (phase shifting circuit) may be an LC circuit having two capacitors connected in series to each other, an inductor connected between one end of one capacitor of the two capacitors and ground, and an inductor connected between the other end of the one capacitor and ground.

The bias circuit 51 is an example of a first bias circuit, is connected to the carrier amplifier 11, and supplies the first bias current to the carrier amplifier 11.

The bias circuit 52 is an example of a second bias circuit, is connected to the peak amplifiers 12 and 20, and supplies the second bias current different from the first bias current to the peak amplifier 12 and supplies the third bias current different from the first bias current to the peak amplifier 20.

In the present exemplary embodiment, a bias current is supplied to each amplifier from the bias circuits 51 and 52, but a bias voltage may be supplied from the bias circuits 51 and 52, and the bias voltage may be supplied as a bias current by a resistance element disposed in a path connecting the bias circuits 51 and 52 and each amplifier.

The first bias current supplied to the carrier amplifier 11 by the bias circuit 51 is larger than the second bias current supplied to the peak amplifier 12 by the bias circuit 52 and is larger than the third bias current supplied to the peak amplifier 20 by the bias circuit 52.

Accordingly, it is possible to operate the carrier amplifier 11 in a C-class and to operate the peak amplifiers 12 and 20 in an A-class or an AB-class.

The phase shifting circuit 70 distributes the high-frequency signal output from the RFIC 3 and outputs each of the distributed signals to the carrier amplifier 11 and the peak amplifiers 12 and 20. In this case, the phase shifting circuit 70 adjusts the phases of the distributed signals. The phase shifting circuit 70 shifts (delays by 90 degrees) a signal output to the peak amplifier 20 by −90 degrees with respect to a signal output to the carrier amplifier 11 and the peak amplifier 12. The phase shifting circuit 70 may be a 1-input 2-output type transformer or may be an LC circuit formed of at least one of an inductor or a capacitor.

The phase shifting circuit 70 may be individually disposed on the input end side of each of the carrier amplifier 11 and the peak amplifiers 12 and 20. In addition, a preamplifier may be connected and disposed on the input end sides of the carrier amplifier 11 and the peak amplifiers 12 and 20. In addition, the amplifier circuit 10 does not need to include the phase shifting circuit 70. In this case, a first high-frequency signal may be output from the RFIC 3 to the carrier amplifier 11 and the peak amplifier 12, and a second high-frequency signal may be output from the RFIC 3 to the peak amplifier 20.

According to the connection configuration of the high-frequency module 1, the signal of the band A output from the carrier amplifier 11 and the peak amplifier 12 and the signal of the band A output from the peak amplifier 20 are voltage-synthesized, and the voltage-synthesized output signal is output to the switch 61. In addition, the signal of the band B output from the carrier amplifier 11 and the peak amplifier 12 and the signal of the band B output from the peak amplifier 20 are voltage-synthesized, and the voltage-synthesized output signal is output to the switch 61.

In addition, the carrier amplifier 11, the peak amplifier 12, and the peak amplifier 20 are included in a semiconductor IC (semiconductor integrated circuit component) 80. The semiconductor IC 80 is formed by using, for example, a complementary metal oxide semiconductor (CMOS), and specifically, may be manufactured by a silicon on insulator (SOI) process. In addition, each of the semiconductor ICs 80 may be composed of at least one of GaAs, SiGe, or GaN. The semiconductor material of the semiconductor IC 80 is not limited to the above-described material.

On the surface of the semiconductor IC 80, an input terminal 110A (first input terminal) and an input terminal 110B (second input terminal) for the semiconductor IC 80 to receive a high-frequency signal from an external circuit, and an output terminal 111 (first output terminal) and an output terminal 112 (second output terminal) for the semiconductor IC 80 to output a high-frequency signal are disposed. The phase shifting circuit 70 may be included in the semiconductor IC 80. In this case, the signal input terminals 110 are disposed on the surface of the semiconductor IC 80 as the first input terminal and the second input terminal instead of the input terminals 110A and 110B.

In the amplifier circuit 10, an input end of the carrier amplifier 11 and an input end of the peak amplifier 12 are connected to the input terminal 110A, and an output end of the carrier amplifier 11 and an output end of the peak amplifier 12 are connected to the output terminal 111. That is, the carrier amplifier 11 and the peak amplifier 12 are connected in parallel. In addition, an input end of the peak amplifier 20 is connected to the input terminal 110B, and an output end of the peak amplifier 20 is connected to the output terminal 112. In addition, one end of the input-side coil 301 is connected to the output terminal 111, one end of the phase shifting line 40 is connected to the output terminal 112, and the other end of the phase shifting line 40 is connected to the other end of the input-side coil 301. One end of the output-side coil 302 is connected to the signal output terminal 120, and the other end of the output-side coil 302 is connected to the ground.

The high-frequency module 1 according to the present exemplary embodiment is a high-frequency circuit having a Doherty-type amplifier, including a parallel-connected carrier amplifier 11 and a peak amplifier 12, and a peak amplifier 20, in which the parallel-connected carrier amplifier 11 and the peak amplifier 12 amplify a second high-frequency signal distributed from a first high-frequency signal to output a first amplification signal, the peak amplifier 20 amplifies a third high-frequency signal distributed from the first high-frequency signal to output a second amplification signal, and the high-frequency module 1 further includes a synthesis circuit that synthesizes the first amplification signal and the second amplification signal to output a synthesized signal. The above-described synthesis circuit is the transformer 30 and the phase shifting line 40.

[1.3 Operation of Amplifier Circuit 10]

Next, the operation of the amplifier circuit 10 will be described.

Figure 2A:
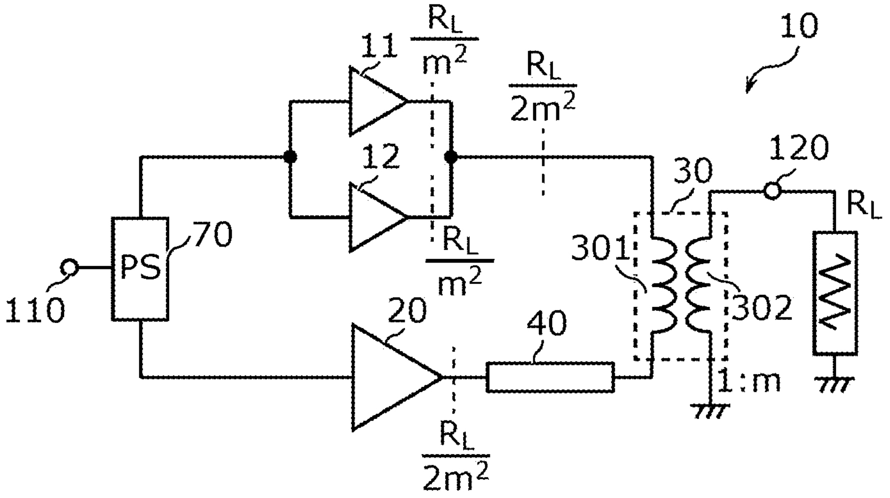
FIG. 2A is a circuit state diagram of an amplifier circuit according to the exemplary embodiment when a large signal is input.
Figure 2B:
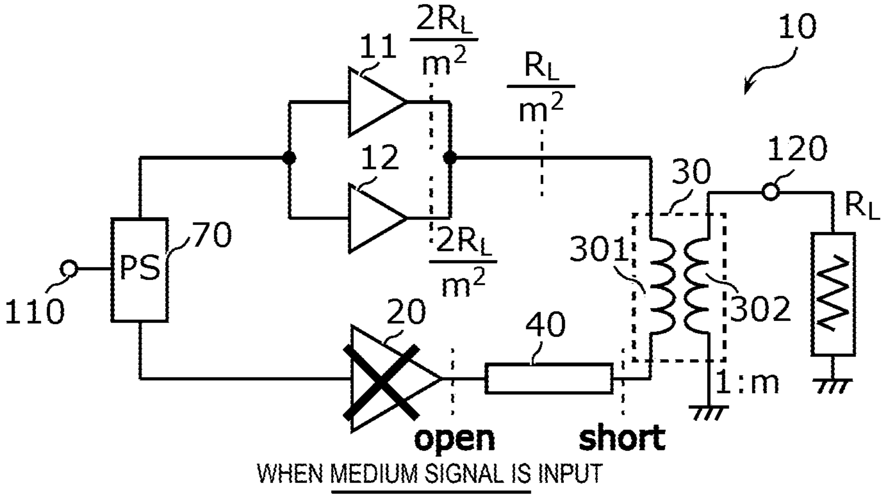
FIG. 2B is a circuit state diagram of the amplifier circuit according to the exemplary embodiment when a medium signal is input.

FIG. 2A is a circuit state diagram of an amplifier circuit 10 according to the exemplary embodiment when a large signal is input. In addition, FIG. 2B is a circuit state diagram of the amplifier circuit 10 according to the exemplary embodiment when a medium signal is input. In addition, FIG. 2C is a circuit state diagram of the amplifier circuit 10 according to the exemplary embodiment when a small signal is input.

First, as shown in FIG. 2A, in a case where the carrier amplifier 11, the peak amplifier 12, and the peak amplifier 20 are operated (ON) (when a large signal is input), the output impedance of the carrier amplifier 11 and the output impedance of the peak amplifier 12 are each represented by $R_L/m^2$. As a result, the output impedance at the connection point on the output side of the carrier amplifier 11 and the peak amplifier 12 is represented by $R_L/2m^2$. In addition, the output impedance of the peak amplifier 20 is represented by $R_L/2m^2$. The transformer 30 is configured to change the pressure at a ratio of 1:m. In addition, the impedance of the load connected to the signal output terminal 120 is $R_L$.

Next, as shown in FIG. 2B, in a case where the carrier amplifier 11 and the peak amplifier 12 are operated (ON) and the peak amplifier 20 is not operated (OFF) (when a medium signal is input), the output impedance of the carrier amplifier 11 and the output impedance of the peak amplifier 12 are each represented by $2R_L/m^2$. As a result, the output impedance at the connection point on the output side of the carrier amplifier 11 and the peak amplifier 12 is represented by $R_L/m^2$. At this time, the output impedance of the peak amplifier 20 is in an open state.

Figure 2C:
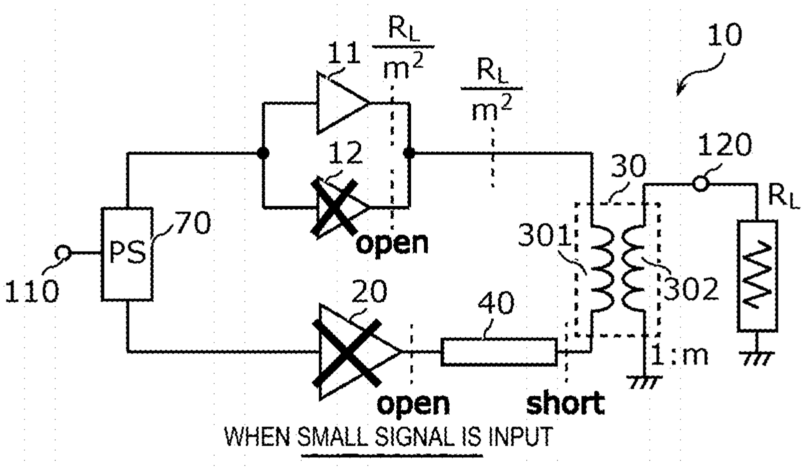
FIG. 2C is a circuit state diagram of the amplifier circuit according to the exemplary embodiment when a small signal is input.

Next, as shown in FIG. 2C, in a case where the carrier amplifier 11 is operated (ON) and the peak amplifiers 12 and 20 are not operated (OFF) (when a small signal is input), the output impedance of the carrier amplifier 11 is represented by $R_L/m^2$. At this time, the output impedance of each of the peak amplifiers 12 and 20 is in an open state.

As described above, the output impedance at the connection point on the output side of the carrier amplifier 11 and the peak amplifier 12 is doubled in the case of the medium signal input in the case of the large signal input. That is, in a case of the medium signal input, the peak amplifier 20 is turned off, and the output impedance of the carrier amplifier 11 and the peak amplifier 12 is increased. Therefore, the amplifier circuit 10 can operate with high efficiency. Further, the output impedance at the connection point on the output side of the carrier amplifier 11 and the peak amplifier 12 is doubled when a small signal input as compared with when a large signal is input. That is, when a small signal is input, the peak amplifiers 12 and 20 are turned off, and the output impedance at the connection point on the output side between the carrier amplifier 11 and the peak amplifier 12 is increased. Therefore, the amplifier circuit 10 can operate with high efficiency. In addition, when a large signal is input, the carrier amplifier 11, the peak amplifier 12, and the peak amplifier 20 can be operated to output a high-power signal, and the output impedance of the carrier amplifier 11 and the peak amplifier 12 and the output impedance of the peak amplifier 20 at the connection point on the output side can be reduced, thereby suppressing signal distortion.

According to the high-frequency module 1 according to the exemplary embodiment, since the three amplifier elements, that is, the carrier amplifier 11, the peak amplifier 12, and the peak amplifier 20 are provided, an amount of back-off, which is the power difference from a high-output region where the carrier amplifier 11, the peak amplifier 12, and the peak amplifier 20 are turned on to a low-output region where only the carrier amplifier 11 is turned on, can be increased in stages. In particular, since the output impedance of the carrier amplifier 11 and the peak amplifier 12 in a medium-output region can be increased, the efficiency in the medium-output region can be increased. In addition, since a phase shifting circuit is not connected to the output end of the peak amplifier 12, the high-frequency module 1 can be reduced in size.

The high-output region is a region where the carrier amplifier 11, the peak amplifier 12, and the peak amplifier 20 are turned on, the medium-output region is a region where the carrier amplifier 11 and the peak amplifier 12 are turned on and the peak amplifier 20 is turned off, and the low-output region is a region where the carrier amplifier 11 is turned on and the peak amplifier 12 and the peak amplifier 20 are turned off.

[1.4 Circuit Configuration of Amplifier Circuit 510 according to Comparative Example 1]

Figure 3:
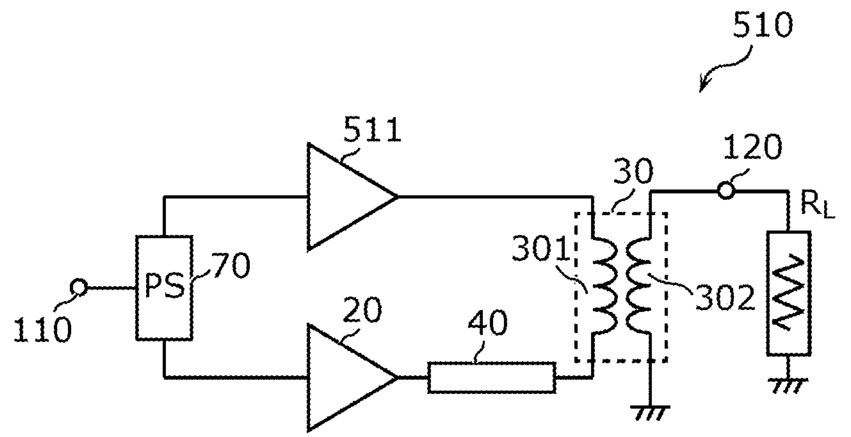
FIG. 3 is a circuit configuration diagram of an amplifier circuit according to Comparative Example 1.

FIG. 3 is a circuit configuration diagram of an amplifier circuit 510 according to Comparative Example 1. The amplifier circuit 510 according to the present comparative example is a conventional two-way Doherty-type amplifier circuit that amplifies a high-frequency signal of the band A and a high-frequency signal of the band B and transmits the amplified signals. As shown in FIG. 3, the amplifier circuit 510 includes a carrier amplifier 511, the peak amplifier 20, the phase shifting line 40, the transformer 30, and the phase shifting circuit 70. The amplifier circuit 510 according to the present comparative example is different from the amplifier circuit 10 according to the exemplary embodiment in that the carrier amplifier 511 is added instead of the carrier amplifier 11 and the peak amplifier 12. Hereinafter, the amplifier circuit 510 according to the present comparative example will be mainly described with a focus on a configuration different from that of the amplifier circuit 10 according to the exemplary embodiment.

The carrier amplifier 511 amplifies a high-frequency signal of the band A or the band B input to the carrier amplifier 511. The carrier amplifier 511 is, for example, an A-class (or AB-class) amplifier circuit that can perform an amplification operation with respect to all power levels of signals input to the carrier amplifier 511, and particularly, can perform amplification operation with high efficiency in a low-output region and a medium-output region.

An input end of the carrier amplifier 511 is connected to the phase shifting circuit 70, and an output end of the carrier amplifier 511 is connected to one end of the input-side coil 301. The input end of the peak amplifier 20 is connected to the phase shifting circuit 70, and the output end of the peak amplifier 20 is connected to one end of the phase shifting line 40. The other end of the phase shifting line 40 is connected to the other end of the input-side coil 301. One end of the output-side coil 302 is connected to the signal output terminal 120, and the other end of the output-side coil 302 is connected to the ground.

In the amplifier circuit 510 according to the present comparative example, the output impedance of the carrier amplifier 511 is two times when a small signal is input as compared with when a large signal is input. That is, when a small signal is input, the peak amplifier 20 is turned off, and the output impedance of the carrier amplifier 511 is increased. Therefore, the amplifier circuit 510 can operate with high efficiency. On the other hand, when a large signal is input, the carrier amplifier 511 and the peak amplifier 20 can be operated to output a high-power signal, and the output impedance of the peak amplifier 20 is low, thereby suppressing signal distortion.

[1.5 Characteristics Comparison of Amplifier Circuits according to Exemplary embodiment and Comparative Example 1]

Figure 4:
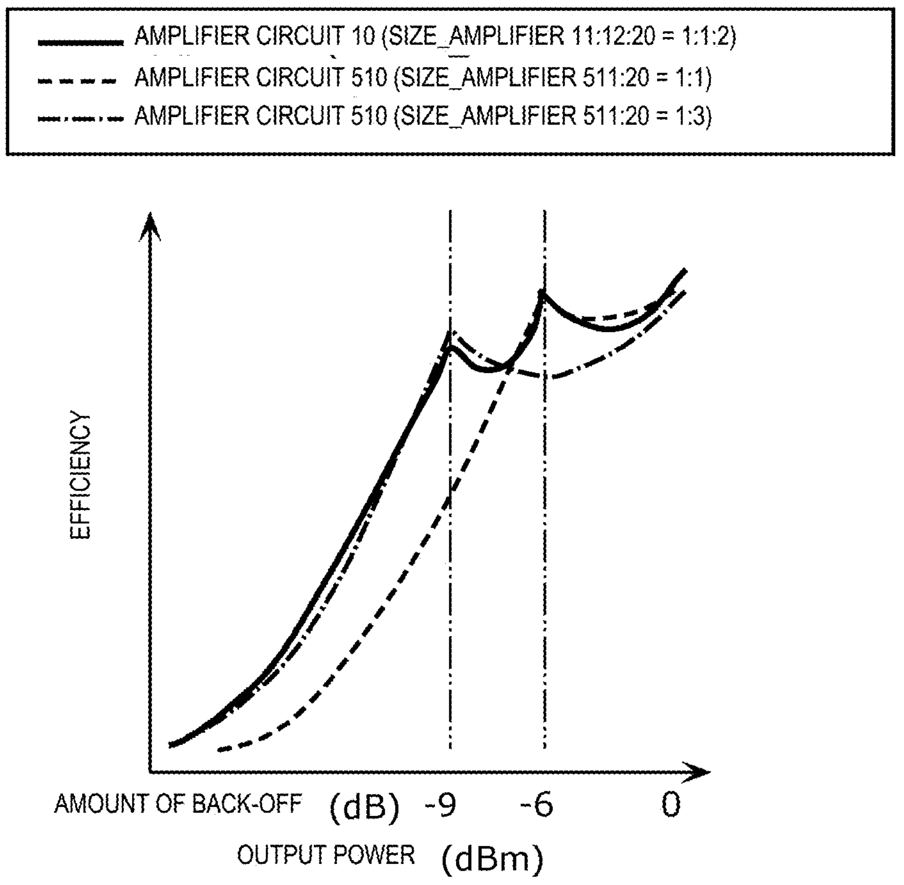
FIG. 4 is a graph showing a relationship between output power and efficiency in the amplifier circuits according to the exemplary embodiment and Comparative Example 1.

FIG. 4 is a graph showing a relationship between output power and efficiency in the amplifier circuits according to the exemplary embodiment and Comparative Example 1. In FIG. 4, the horizontal axis is the power level of the signal output from the amplifier circuit 10 or 510, and the vertical axis is the efficiency (power added efficiency) of each amplifier circuit.

As shown in FIG. 4, in the amplifier circuit 510 according to Comparative Example 1, in a case where the size of the amplifier transistor constituting the carrier amplifier 511 and the size of the amplifier transistor constituting the peak amplifier 20 are equal to each other (size amplifier 511:20=1:1 in FIG. 4), an amount of back-off, which is the power difference from a high-output region where both the carrier amplifier 511 and the peak amplifier 20 are turned on to a low-output region where only the carrier amplifier 511 is turned on, is 6 dB.

On the other hand, in the amplifier circuit 10 according to the exemplary embodiment, in a case where the size of the amplifier transistor constituting the carrier amplifier 11, the size of the amplifier transistor constituting the peak amplifier 12, and the size of the amplifier transistor constituting the peak amplifier 20 are in a ratio of 1:1:2, that is, in a case where the sum of the size of the amplifier transistor constituting the carrier amplifier 11 and the size of the amplifier transistor constituting the peak amplifier 12 is equal to the size of the amplifier transistor constituting the peak amplifier 20 (size amplifier 11:12:20=1:1:2 in FIG. 4), an amount of back-off, which is the power difference from a high-output region where the carrier amplifier 11, the peak amplifier 12, and the peak amplifier 20 are turned on to a low-output region where only the carrier amplifier 11 is turned on is 9 dB. That is, in the amplifier circuits according to the exemplary embodiment and Comparative Example 1, in a case where the total size of the amplifiers connected to one end of the input-side coil 301 and the size of the amplifier connected to the other end of the input-side coil 301 are equal to each other, the amplifier circuit 10 according to the exemplary embodiment can secure a larger amount of back-off.

In other words, the amplifier circuit 10 according to the exemplary embodiment functions as a two-way Doherty amplifier circuit between a mode in which the carrier amplifier 11 and the peak amplifier 12 are turned on and a mode in which the carrier amplifier 11, the peak amplifier 12, and the peak amplifier 20 are turned on, and thus, an amount of back-off of 6 dB can be secured. In addition, an amount of back-off of 3 dB can be secured between a mode in which the carrier amplifier 11 and the peak amplifier 12 are turned on and a mode in which only the carrier amplifier 11 is turned on.

Figure 5:
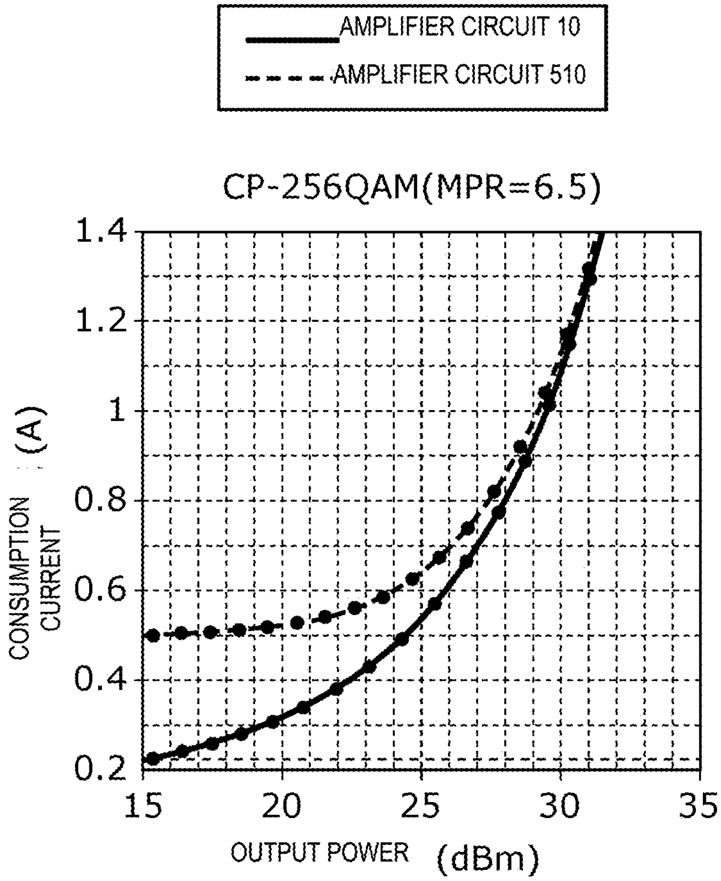
FIG. 5 is a graph showing a relationship between output power and a consumption current in the amplifier circuits according to the exemplary embodiment and Comparative Example 1.

FIG. 5 is a graph showing a relationship between output power and a consumption current in the amplifier circuits according to the exemplary embodiment and Comparative Example 1. In FIG. 5, the horizontal axis is the power level of the signal output from the amplifier circuit 10 or 510, and the vertical axis is the idle current flowing into the carrier amplifiers 11 and 511. In the amplifier circuit 510, in a case where the size of the amplifier transistor constituting the carrier amplifier 511 and the size of the amplifier transistor constituting the peak amplifier 20 are equal to each other, a size ratio of the carrier amplifier 511 to all the amplifiers is 50%. On the other hand, in the amplifier circuit 10, in a case where the total size of the amplifier transistor constituting the carrier amplifier 11 and the size of the amplifier transistor constituting the peak amplifier 12 are equal to the size of the amplifier transistor constituting the peak amplifier 20, the size ratio of the carrier amplifier 11 to all the amplifiers is 25%. According to the difference in the size ratio, the amplifier circuit 10 according to the exemplary embodiment can improve the efficiency since the idle current of the carrier amplifier 11 can be significantly reduced as compared with the amplifier circuit 510 according to Comparative Example 1. As a result, in a modulation method having a large peak to average power ratio (PAPR) (for example, CP256QAM), the frequency of operation in a signal region smaller than the maximum output power is increased. However, since the idle current of the carrier amplifier 11 can be reduced, high efficiency operation can be performed. In addition, since the amount of back-off is large, it is possible to operate with low distortion.

In addition, as shown in FIG. 4, in the amplifier circuit 510 according to Comparative Example 1, in a case where the size of the amplifier transistor constituting the carrier amplifier 511 and the size of the amplifier transistor constituting the peak amplifier 20 are in a ratio of 1:3 (size amplifier 511:20=1:3 in FIG. 4), an amount of back-off, which is the power difference from a high-output region where both the carrier amplifier 511 and the peak amplifier 20 are turned on to a low-output region where only the carrier amplifier 511 is turned on, can be 9 dB.

On the other hand, in the amplifier circuit 10 according to the exemplary embodiment, in a case where the size of the amplifier transistor constituting the carrier amplifier 11, the size of the amplifier transistor constituting the peak amplifier 12, and the size of the amplifier transistor constituting the peak amplifier 20 are in a ratio of 1:1:2, that is, in a case where the size of the amplifier transistor constituting the carrier amplifier 11 and the total size of the amplifier transistors constituting the peak amplifiers 12 and 20 are in a ratio of 1:3 (size amplifier 11:12:20=1:1:2 in FIG. 4), an amount of back-off, which is the difference in power from a high-output region where the carrier amplifier 11, the peak amplifier 12, and the peak amplifier 20 are turned on to a low-output region where only the carrier amplifier 11 is turned on, can be 9 dB. However, the amplifier circuit 10 according to the exemplary embodiment has an improved efficiency in a medium-output region as compared with the amplifier circuit 510 according to Comparative Example 1. This is because, as shown in FIG. 2B, the output impedance of the carrier amplifier 11 and the output impedance of the peak amplifier 12 in the medium-output region can be increased to $2R_L/m^2$.

[1.6 Circuit Configuration of Amplifier Circuit 520 according to Comparative Example 2]

Figure 6:
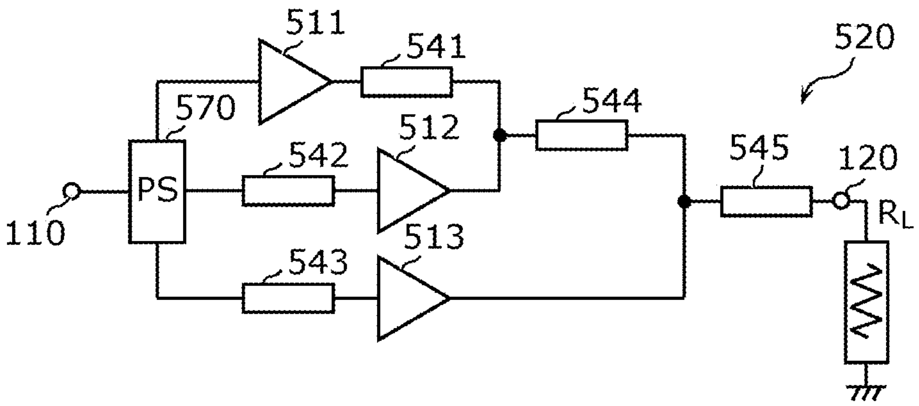
FIG. 6 is a circuit configuration diagram of an amplifier circuit according to Comparative Example 2.

FIG. 6 is a circuit configuration diagram of an amplifier circuit 520 according to Comparative Example 2. The amplifier circuit 520 according to the present comparative example is a three-way Doherty-type amplifier circuit of the related art that amplifies a high-frequency signal of the band A and a high-frequency signal of the band B and transmits the amplified signals. As shown in FIG. 6, the amplifier circuit 520 includes the carrier amplifier 511, peak amplifiers 512 and 513, phase shifting lines 541, 542, 543, 544, and 545, and a phase shifting circuit 570. The amplifier circuit 520 according to the present comparative example is a current-synthesized Doherty-type amplifier circuit in the related art, as compared with the amplifier circuit 10 according to the exemplary embodiment. Hereinafter, the amplifier circuit 520 according to the present comparative example will be mainly described with a focus on a configuration different from that of the amplifier circuit 10 according to the exemplary embodiment.

The carrier amplifier 511 amplifies the high-frequency signal of the band A or the band B input to the carrier amplifier 511. The carrier amplifier 511 is an A-class (or AB-class) amplifier circuit that can amplify all power levels of signals input to the carrier amplifier 511, and particularly, can perform a highly efficient amplification operation in a low-output region and a medium-output region.

The peak amplifier 512 amplifies the high-frequency signal of the band A or the band B input to the peak amplifier 512. The peak amplifier 512 is, for example, a C-class amplifier circuit that can perform an amplification operation in a region where the power level of the signal input to the peak amplifier 512 is high.

The peak amplifier 513 amplifies the high-frequency signal of the band A or the band B input to the peak amplifier 513. The peak amplifier 513 is, for example, a C-class amplifier circuit that can perform an amplification operation in a region where the power level of the signal input to the peak amplifier 513 is high.

The phase shifting lines 541 to 545 is a ¼ wavelength transmission line.

The phase shifting circuit 570 distributes the high-frequency signal output from the RFIC 3 and outputs each of the distributed signals to the carrier amplifier 511, and the peak amplifiers 512 and 513. In this case, the phase shifting circuit 570 adjusts the phases of the distributed signals.

The input end of the carrier amplifier 511 is connected to the phase shifting circuit 70, and the output end of the carrier amplifier 511 is connected to one end of the phase shifting line 541. One end of the phase shifting line 542 is connected to the phase shifting circuit 70, and the other end of the phase shifting line 542 is connected to an input end of the peak amplifier 512. The other end of the phase shifting line 541 and an output end of the peak amplifier 512 are connected to one end of the phase shifting line 544. One end of the phase shifting line 543 is connected to the phase shifting circuit 70, and the other end of the phase shifting line 543 is connected to an input end of the peak amplifier 513. The other end of the phase shifting line 544 and the output end of the peak amplifier 513 are connected to one end of the phase shifting line 545. The other end of the phase shifting line 545 is connected to the signal output terminal 120.

In the amplifier circuit 520 according to the present comparative example, the output impedance of the carrier amplifier 511 is three times when a small signal is input as compared with when a large signal is input. That is, when a small signal is input, the peak amplifiers 512 and 513 are turned off, and the output impedance of the carrier amplifier 511 is increased. Therefore, the amplifier circuit 520 can operate with high efficiency. In addition, when a medium signal is input as compared with when a large signal is input, the output impedance of the carrier amplifier 511 is two times, and the output impedance of the peak amplifier 512 is the same as the output impedance of the carrier amplifier 511. In addition, when a large signal is input, the carrier amplifier 511, the peak amplifier 512, and the peak amplifier 513 are operated to output a high-power signal, and the output impedance of the peak amplifier 512 and the peak amplifier 513 is low, thereby suppressing signal distortion.

According to the amplifier circuit 520 according to Comparative Example 2, since the three amplifier elements of the carrier amplifier 511, the peak amplifier 512, and the peak amplifier 513 are provided, an amount of back-off, which is the power difference from a high-output region where the carrier amplifier 511 and the peak amplifiers 512 and 513 are turned on to a low-output region where only the carrier amplifier 511 is turned on, can be increased in stages.

Figure 7:
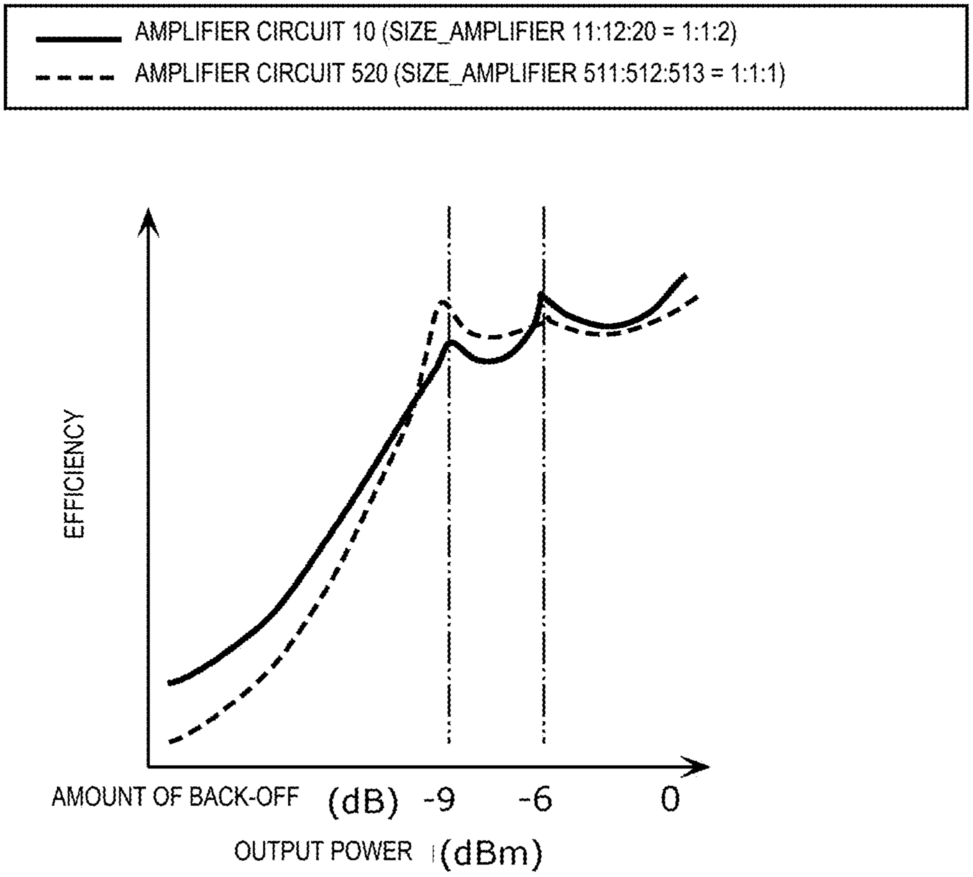
FIG. 7 is a graph showing a relationship between output power and efficiency in the amplifier circuits according to the exemplary embodiment and Comparative Example 2.

FIG. 7 is a graph showing a relationship between output power and efficiency in the amplifier circuits according to the exemplary embodiment and Comparative Example 2. In FIG. 7, the horizontal axis is the power level of the signal output from the amplifier circuit 10 or 520, and the vertical axis is the efficiency (power added efficiency) of each amplifier circuit.

As shown in FIG. 7, in the amplifier circuit 520 according to Comparative Example 2, in a case where the size of the amplifier transistor constituting the carrier amplifier 511, the size of the amplifier transistor constituting the peak amplifier 512, and the size of the amplifier transistor constituting the peak amplifier 513 are equal to each other (size amplifier 511:512:513=1:1:1 in FIG. 7), an amount of back-off, which is the power difference from a high-output region where the carrier amplifier 511, the peak amplifier 512, and the peak amplifier 513 are turned on to a low-output region where only the carrier amplifier 511 is turned on, is 9 dB.

On the other hand, in the amplifier circuit 10 according to the exemplary embodiment, in a case where the size of the amplifier transistor constituting the carrier amplifier 11, the size of the amplifier transistor constituting the peak amplifier 12, and the size of the amplifier transistor constituting the peak amplifier 20 are in a ratio of 1:1:2, that is, in a case where the sum of the size of the amplifier transistor constituting the carrier amplifier 11 and the size of the amplifier transistor constituting the peak amplifier 12 is equal to the size of the amplifier transistor constituting the peak amplifier 20 (size amplifier 11:12:20=1:1:2 in FIG. 7), an amount of back-off, which is the power difference from a high-output region where the carrier amplifier 11, the peak amplifier 12, and the peak amplifier 20 are turned on to a low-output region where only the carrier amplifier 11 is turned on, is 9 dB.

In addition, at this time, the sum of size of the amplifier transistor constituting the carrier amplifier 11, the size of the amplifier transistor constituting the peak amplifier 12, and the size of the amplifier transistor constituting the peak amplifier 20 in the amplifier circuit 10 according to the exemplary embodiment are equal to the sum of the size of the amplifier transistor constituting the carrier amplifier 511, the size of the amplifier transistor constituting the peak amplifier 512, and the size of the amplifier transistor constituting the peak amplifier 513 in the amplifier circuit 520 according to Comparative Example 2. In this case, the amplifier circuit 10 according to the exemplary embodiment has the same total size of the amplifiers as the amplifier circuit 520 according to Comparative Example 2, but since the phase shifting lines are not disposed on the output ends of the carrier amplifier 11 and the peak amplifier 12, it is possible to achieve reduction in size. In addition, since the output impedance of the carrier amplifier 11 in a low-output region is less than three times the output impedance of the carrier amplifier 11 in a high-output region, the efficiency at the point (output power point at which the amount of back-off is 9 dB) at which the peak amplifier 12 is changed from the on state to the off state is lower than that of the amplifier circuit 520 according to Comparative Example 2. However, as the output power is decreased (low-output region) from the point at which the peak amplifier 12 is changed to the off state from on state, the efficiency is higher than that of the amplifier circuit 520 according to Comparative Example 2. This is because a size ratio of the carrier amplifier 11 to the entire amplifiers of the amplifier circuit 10 according to the exemplary embodiment is smaller than a size ratio of the carrier amplifier 511 to the entire amplifiers of the amplifier circuit 520 according to Comparative Example 2.

That is, as compared with the two-way Doherty-type amplifier circuit according to Comparative Example 1, since the amplifier circuit 10 according to the present exemplary embodiment can perform an amplification operation on the three amplifier elements in stages without increasing the sizes of the amplifier elements, it is possible to secure a large amount of back-off, and it is possible to increase the efficiency in a medium-output region. In addition, it is possible to reduce the size while increasing the efficiency in a low-output region as compared with the three-way Doherty-type amplifier circuit according to Comparative Example 2.

The size of the amplifier transistor constituting each amplifier is defined as an area of a region of forming the amplifier transistor included in the amplifier in a case where a main surface of the semiconductor IC 80 on which the amplifier is disposed is viewed in a plan view (perspective view). The size of the amplifier transistor constituting each amplifier depends on the number of stages, the number of cells, or the number of fingers of the transistor element constituting the amplifier transistor. Therefore, the case where the size of the amplifier transistor is large is a state in which at least one of the cases where the number of stages of the transistor element or the number of cells or the number of fingers is large.

In addition, the expression "the sizes of the amplifier transistors constituting the two amplifiers are equal to each other" includes not only a case where the sizes of the amplifier transistors constituting the two amplifiers exactly match but also the case where the sizes of the amplifier transistors constituting the two amplifiers are substantially equal to each other. Here, the size of the amplifier transistor constituting the amplifier is represented by an area (a scale of a range of the two-dimensional region). The fact that the sizes of the amplifier transistors constituting the two amplifiers are substantially equal to each other means that a ratio of a difference value between the sizes of the amplifier transistors constituting the two amplifiers to a larger one of the sizes of the amplifier transistors constituting the two amplifiers is 10% or less.

In addition, the area of the region where the amplifier transistor is formed can be measured by recognizing the regions of an N-type and a P-type semiconductors in the image of the amplifier transistor captured by irradiating the semiconductor IC 80 with X-rays from the normal direction of the main surface.

In addition, each amplifier transistor constituting an amplifier may have a configuration in which a plurality of transistor elements are connected in parallel. In this case, in a case where each of the plurality of transistor elements is a common-emitter bipolar transistor, the number of amplifier transistors is determined by the number of collector terminals. That is, the number of amplifier transistors and the number of collector terminals correspond to each other in a one-to-one manner.

In addition, the number of ways, such as two-way and three-way, is defined by the number of output terminals provided on the surface of the semiconductor integrated circuit component included in each amplifier. The output terminal is a terminal to which an output end of each amplifier is connected. That is, in a case where the number of output terminals provided on the surface of the semiconductor integrated circuit component is two, the circuit is a two-way Doherty amplifier circuit, and in a case where the number of output terminals provided on the surface of the semiconductor integrated circuit component is three, the circuit is a three-way Doherty amplifier circuit.

[1.7 Specific Circuit Configuration of Amplifier Circuit]

Figure 8A:
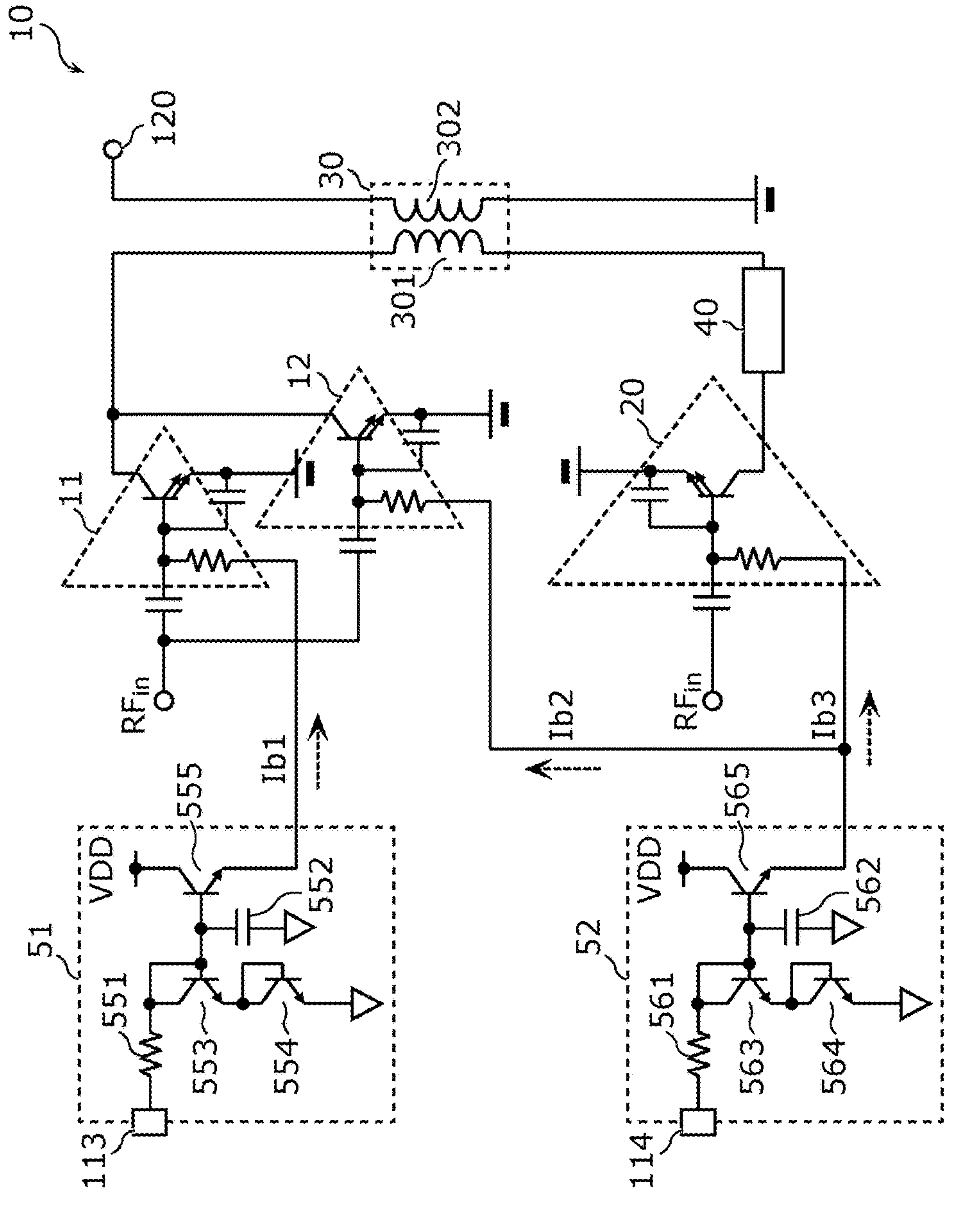
FIG. 8A is a circuit configuration diagram of the amplifier circuit according to the exemplary embodiment.

FIG. 8A is a circuit configuration diagram of the amplifier circuit 10 according to the exemplary embodiment. FIG. 8A shows a circuit configuration example of the bias circuits 51 and 52 included in the amplifier circuit 10.

Each of the amplifier transistors constituting the carrier amplifier 11, and the peak amplifiers 12 and 20 is, for example, a common-emitter bipolar transistor.

The bias circuit 51 includes a current input terminal 113, a resistance element 551, a capacitor 552, and transistors 553, 554, and 555. The current input terminal 113 is an example of a first current input terminal and is a terminal for the bias circuit 51 to receive a first constant current. The first constant current is input to the current input terminal 113 from an external constant current source circuit. The transistors 553 and 554 are connected to diodes, respectively, and a collector of the transistor 553 is connected to the current input terminal 113 with the resistance element 551 interposed therebetween. An emitter of the transistor 553 is connected to a collector of the transistor 554, and an emitter of the transistor 554 is connected to the ground. The bases of the transistors 553 and 555 are connected to each other to configure a current mirror circuit. The capacitor 552 is connected between the base and the ground of the transistors 553 and 555. With the above configuration, a bias current Ib1 (first bias current) is supplied from the emitter of the transistor 555 to the base terminal of the amplifier transistor of the carrier amplifier 11.

The bias circuit 52 includes a current input terminal 114, a resistance element 561, a capacitor 562, and transistors 563, 564, and 565. The current input terminal 114 is an example of a second current input terminal and is a terminal for the bias circuit 52 to receive a second constant current. The second constant current is input to the current input terminal 114 from an external constant current source circuit. Since the connection configuration of each circuit element is the same as that of the bias circuit 51, the description thereof will be omitted. A bias current Ib2 (second bias current) is supplied from the emitter of the transistor 565 to the base terminal of the amplifier transistor of the peak amplifier 12. In addition, a bias current Ib3 (third bias current) is supplied from the emitter of the transistor 565 to the base terminal of the amplifier transistor of the peak amplifier 20.

Here, the bias current Ib1 is larger than the bias current Ib2 and is larger than the bias current Ib3. Accordingly, it is possible to operate the carrier amplifier 11 in the C-class and to operate the peak amplifiers 12 and 20 in the A-class or the AB-class. In addition, since the three amplifiers are classified into the carrier amplifier 11 and the peak amplifiers 12 and 20 according to the magnitude of the bias current and the bias current is supplied to the carrier amplifier 11 and the peak amplifiers 12 and 20 by two bias circuits, the amplifier circuit 10 can be reduced in size.

Figure 8B:
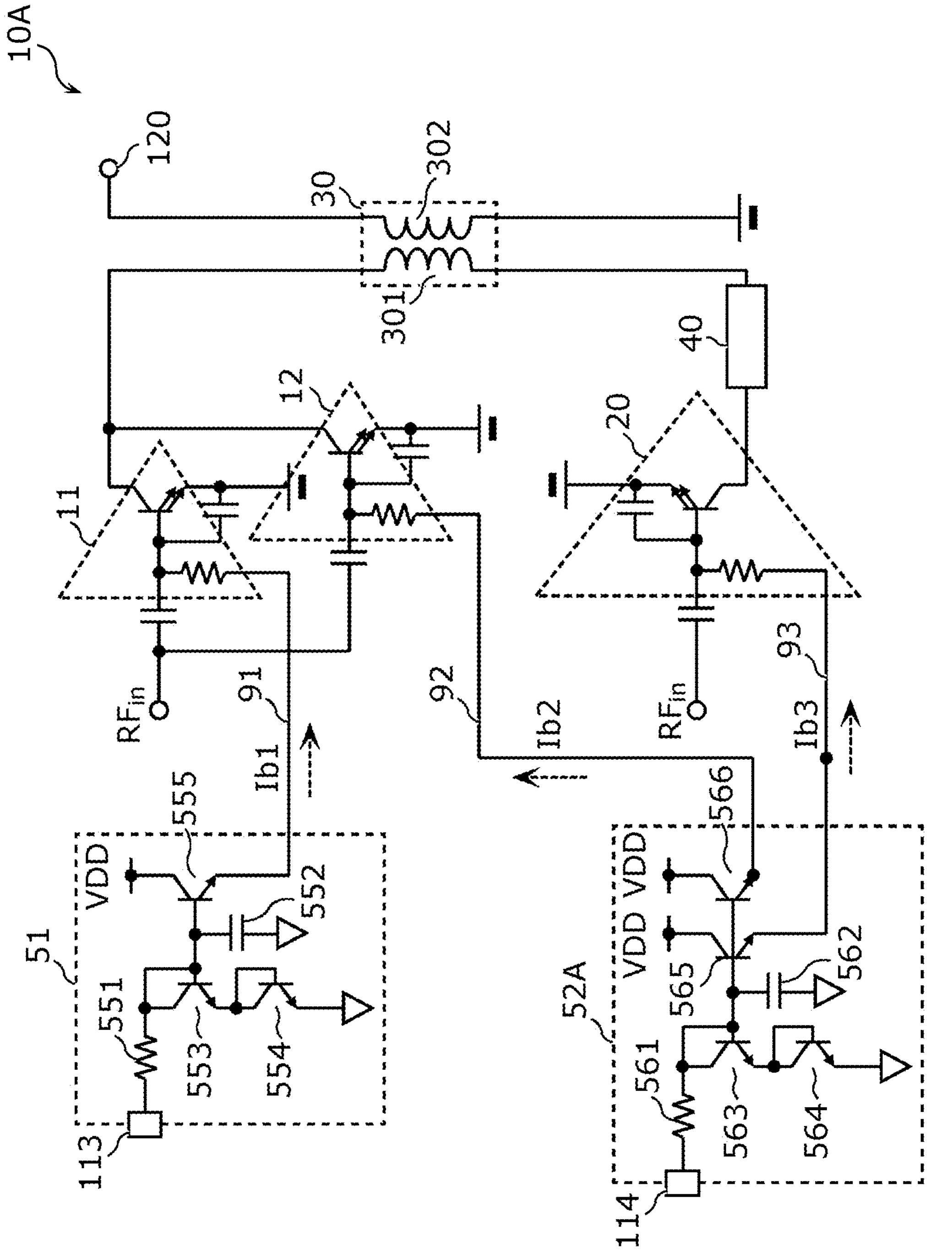
FIG. 8B is a circuit configuration diagram of an amplifier circuit according to Modification Example 1.

FIG. 8B is a circuit configuration diagram of an amplifier circuit 10A according to a modification example 1. FIG. 8B shows a circuit configuration example of the bias circuits 51 and 52A included in the amplifier circuit 10A. The amplifier circuit 10A includes the signal input terminal 110 and the signal output terminal 120, the carrier amplifier 11, the peak amplifiers 12 and 20, the phase shifting line 40, the transformer 30, and the bias circuits 51 and 52A. The amplifier circuit 10A according to the present modification example is different from the amplifier circuit 10 according to the exemplary embodiment in terms of the configuration of the bias circuit 52A and the configuration in which a bias current is supplied from the bias circuit 52A. Hereinafter, the amplifier circuit 10A according to the present modification example will be mainly described with a focus on a configuration different from that of the amplifier circuit 10 according to the exemplary embodiment.

An output end of the transistor 555 of the bias circuit 51 is connected to the carrier amplifier 11 via a wiring 91.

The bias circuit 52A includes the current input terminal 114, a resistance element 561, a capacitor 562, and transistors 563, 564, 565, and 566. The current input terminal 114 is an example of a second current input terminal and is a terminal for the bias circuit 52A to receive the second constant current. The transistors 563 and 564 are connected to diodes, respectively, and a collector of the transistor 563 is connected to the current input terminal 114 with the resistance element 561 interposed therebetween. An emitter of the transistor 563 is connected to a collector of the transistor 564, and an emitter of the transistor 564 is connected to the ground. The bases of the transistors 563 and 565 are connected to each other to configure a current mirror circuit. In addition, the bases of the transistors 563 and 566 are connected to each other to configure a current mirror circuit. The capacitor 562 is connected between the base and the ground of the transistors 563, 565, and 566.

An output end of the transistor 566 (first transistor) is connected to the peak amplifier 12 via a wiring 92 (first wiring), and an output end of the transistor 565 (second transistor) is connected to the peak amplifier 20 via a wiring 93 (second wiring). With the above configuration, the bias current Ib3 (third bias current) is supplied from the emitter of the transistor 565 to the base terminal of the amplifier transistor of the peak amplifier 20. In addition, the bias current Ib2 (second bias current) is supplied from the emitter of the transistor 566 to the base terminal of the amplifier transistor of the peak amplifier 12.

Here, the bias current Ib1 is larger than the bias current Ib2 and is larger than the bias current Ib3. Accordingly, it is possible to operate the carrier amplifier 11 in the C-class and to operate the peak amplifiers 12 and 20 in the A-class or the AB-class. In addition, since the three amplifiers are classified into the carrier amplifier 11 and the peak amplifiers 12 and 20 according to the magnitude of the bias current and the bias current is supplied to the carrier amplifier 11 and the peak amplifiers 12 and 20 by two bias circuits, the amplifier circuit 10A can be reduced in size. Further, since the bias currents Ib2 and Ib3 are supplied from the transistors 566 and 565, respectively, the magnitudes of the bias current Ib2 and the bias current Ib3 can be made different from each other. In addition, since the bias currents Ib2 and Ib3 are supplied to the peak amplifiers 12 and 20 by the wirings 92 and 93, respectively, it is possible to suppress the bias currents Ib2 and Ib3 from interfering with each other and becoming noise sources.

Figure 8C:
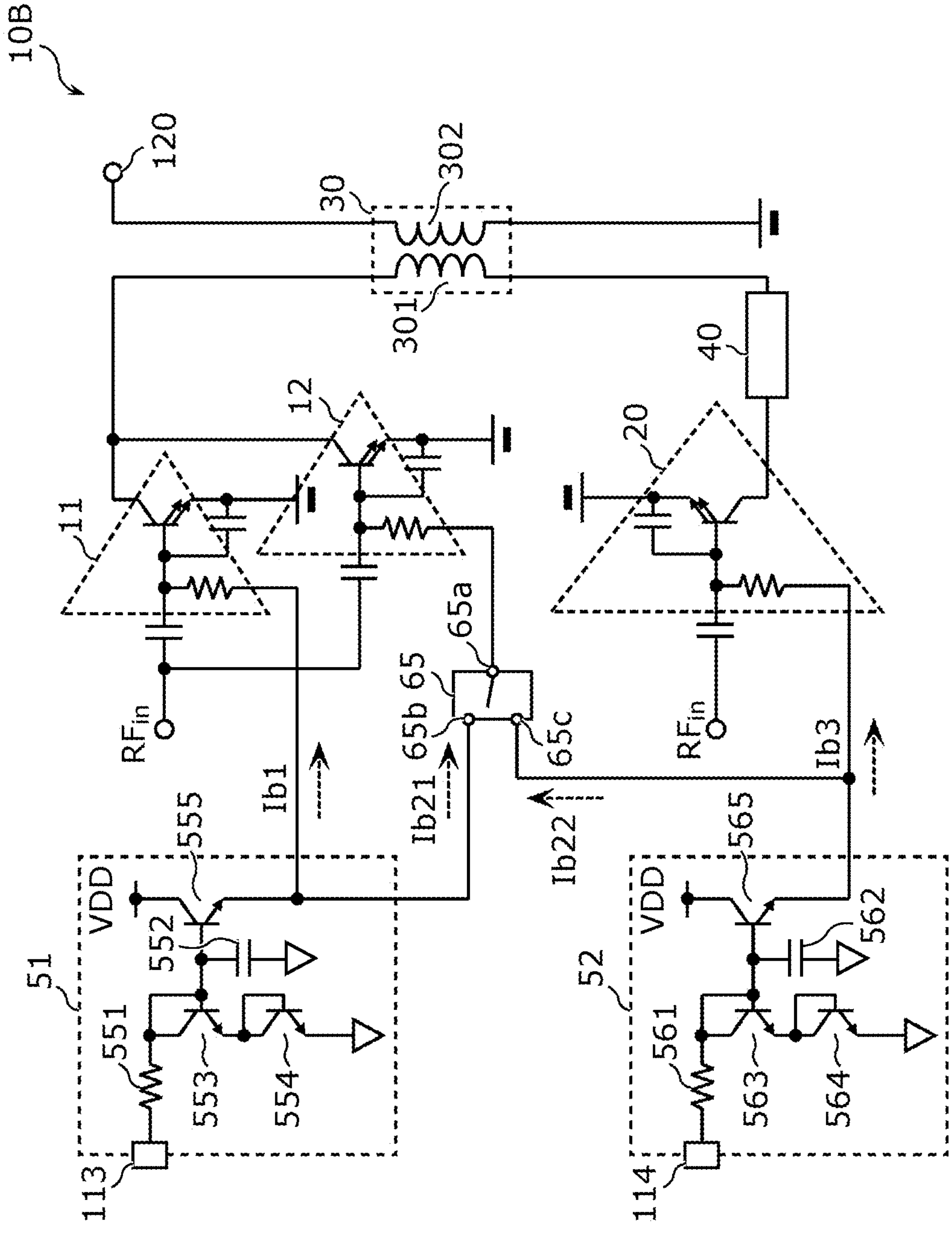
FIG. 8C is a circuit configuration diagram of an amplifier circuit according to Modification Example 2.

FIG. 8C is a circuit configuration diagram of an amplifier circuit 10B according to Modification Example 2. FIG. 8C shows a circuit configuration example of the bias circuits 51 and 52 included in the amplifier circuit 10B. The amplifier circuit 10B includes the signal input terminal 110, the signal output terminal 120, the carrier amplifier 11, the peak amplifiers 12 and 20, the phase shifting line 40, a transformer 30, the bias circuits 51 and 52, and a switch 65. The amplifier circuit 10B according to the present modification example is different from the amplifier circuit 10 according to the exemplary embodiment in that a switch 65 that switches a supply source of the bias current supplied to the peak amplifier 12 is added. Hereinafter, the amplifier circuit 10B according to the present modification example will be described mainly with a focus on a configuration different from that of the amplifier circuit 10 according to the exemplary embodiment.

The switch 65 includes a terminal 65*a* (first terminal), a terminal 65*b* (second terminal), and a terminal 65*c* (third terminal), and switches connection between the terminal 65*a* and the terminal 65*b* and connection between the terminal 65*a* and the terminal 65*c*. The terminal 65*a* is connected to the base terminal of the amplifier transistor constituting the peak amplifier 12, the terminal 65*b* is connected to the transistor 555 of the bias circuit 51, and the terminal 65*c* is connected to the transistor 565 of the bias circuit 52.

In the circuit configuration, the bias current Ib1 (first bias current) output from the transistor 555 of the bias circuit 51 is supplied to the base terminal of the amplifier transistor of the carrier amplifier 11 via a resistor. In addition, a bias current Ib22 (second bias current) output from the transistor 565 of the bias circuit 52 is supplied to the base terminal of the amplifier transistor of the peak amplifier 12 via the switch 65 and a resistor, or the bias current Ib21 output from the transistor 555 of the bias circuit 51 is supplied to the base terminal of the amplifier transistor of the peak amplifier 12 via the switch 65 and a resistor. In addition, the bias current Ib3 (third bias current) output from the transistor 565 of the bias circuit 52 is supplied to the base terminal of the amplifier transistor of the peak amplifier 20 via a resistor.

Here, the bias current Ib1 is larger than the bias current Ib22 and is larger than the bias current Ib3. In addition, the bias current Ib21 is larger than the bias current Ib22 and is larger than the bias current Ib3. Accordingly, it is possible to select and combine any one of the amplification characteristics of the carrier amplifier 11 or the amplification characteristics of the peak amplifier 20 with the amplification characteristics of the peak amplifier 12. Therefore, the amount of back-off can be adjusted.

The switch 65 may be included in the semiconductor IC 80. Accordingly, the amplifier circuit 10B can be reduced in size.

[1.8 Circuit Configuration of High-Frequency Module 1C according to Modification Example 3]

Figure 9:
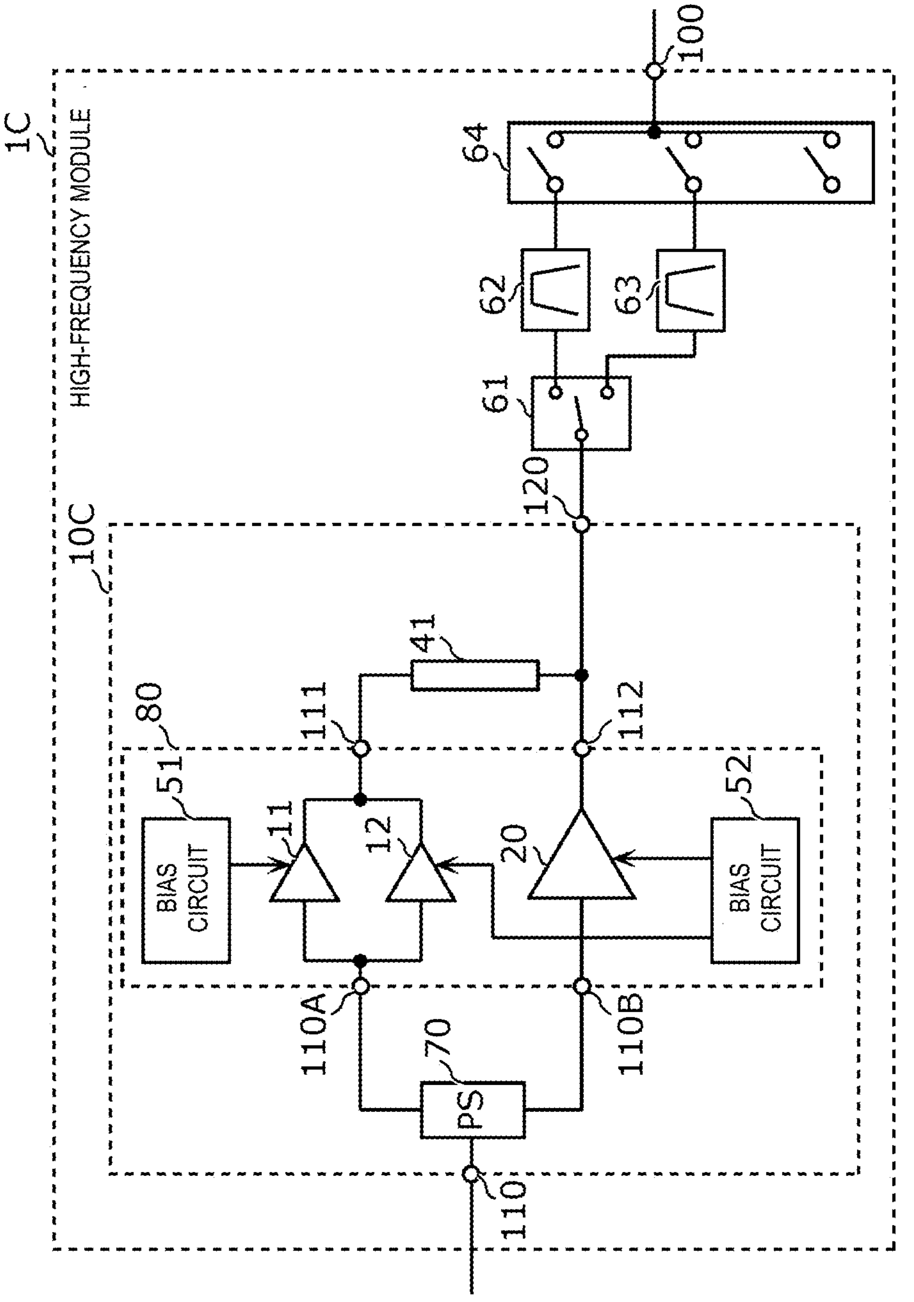
FIG. 9 is a circuit configuration diagram of a high-frequency module according to Modification Example 3.

FIG. 9 is a circuit configuration diagram of a high-frequency module 1C according to Modification Example 3.

As shown in FIG. 9, the high-frequency module 1C includes an amplifier circuit 10C, the filters 62 and 63, switches 61 and 64, and the antenna connection terminal 100. The high-frequency module 1C according to the present modification example is different from the high-frequency module 1 according to the exemplary embodiment in terms of the configuration of the amplifier circuit 10C. Hereinafter, the configuration of the amplifier circuit 10C having a configuration different from that of the high-frequency module 1 according to the exemplary embodiment will be described with respect to the high-frequency module 1C according to the present modification example.

As shown in FIG. 9, the amplifier circuit 10C includes the signal input terminal 110 and the signal output terminal 120, the carrier amplifier 11, the peak amplifiers 12 and 20, a phase shifting line 41, the phase shifting circuit 70, and the bias circuits 51 and 52. The amplifier circuit 10 according to the exemplary embodiment is a voltage-synthesized Doherty amplifier circuit, whereas the amplifier circuit 10C according to the present modification example is a current-synthesized Doherty amplifier circuit. Hereinafter, the amplifier circuit 10C according to the present modification example will be described with a focus on a configuration different from the amplifier circuit 10 according to the exemplary embodiment without describing the same configuration.

The phase shifting line 41 is an example of a phase shifting circuit, and is, for example, a ¼ wavelength transmission line. The phase shifting line 41 delays a phase of the high-frequency signal input from one end thereof by ¼ wavelength and outputs the delayed signal from the other end.

In the amplifier circuit 10C, the input end of the carrier amplifier 11 and the input end of the peak amplifier 12 are connected to the input terminal 110A, and the output end of the carrier amplifier 11 and the output end of the peak amplifier 12 are connected to the output terminal 111. In addition, the input end of the peak amplifier 20 is connected to the input terminal 110B, and the output end of the peak amplifier 20 is connected to the output terminal 112. In addition, one end of the phase shifting line 41 is connected to the output terminal 111, and the other end of the phase shifting line 41 is connected to the signal output terminal 120 and the output terminal 112.

According to the above-described connection configuration of the high-frequency module 1C, the signal of the band A output from the carrier amplifier 11 and the peak amplifier 12 and the signal of the band A output from the peak amplifier 20 are current-synthesized, and the current synthesized output signal is output to the switch 61. In addition, the signal of the band B output from the carrier amplifier 11 and the peak amplifier 12 and the signal of the band B output from the peak amplifier 20 current-synthesized, and the current-synthesized output signal is output to the switch 61.

In addition, the carrier amplifier 11, the peak amplifier 12, and the peak amplifier 20 are included in the semiconductor IC 80. The semiconductor IC 80 is configured by using, for example, CMOS, and may be manufactured by an SOI process. In addition, each of the semiconductor ICs 80 may be composed of at least one of GaAs, SiGe, or GaN. The semiconductor material of the semiconductor IC 80 is not limited to the above-described material.

On the surface of the semiconductor IC 80, the input terminal 110A (first input terminal) and the input terminal 110B (second input terminal) for the semiconductor IC 80 to receive a high-frequency signal from an external circuit, and the output terminal 111 (first output terminal) and the output terminal 112 (second output terminal) for the semiconductor IC 80 to output a high-frequency signal are disposed. The phase shifting circuit 70 may be included in the semiconductor IC 80. In this case, the signal input terminals 110 are disposed on the surface of the semiconductor IC 80 as the first input terminal and the second input terminal instead of the input terminals 110A and 110B.

The high-frequency module 1C according to the present modification example is a high-frequency circuit having a Doherty-type amplifier, including a parallel-connected carrier amplifier 11 and a peak amplifier 12, and a peak amplifier 20, in which the parallel-connected carrier amplifier 11 and the peak amplifier 12 amplify a second high-frequency signal distributed from a first high-frequency signal to output a first amplification signal, the peak amplifier 20 amplifies a third high-frequency signal distributed from the first high-frequency signal to output a second amplification signal, and the high-frequency module 1C further includes a synthesis circuit that synthesizes the first amplification signal and the second amplification signal to output a synthesized signal. The above-described synthesis circuit is the phase shifting line 41.

As compared with the two-way Doherty-type amplifier circuit according to Comparative Example 1, since the amplifier circuit 10C according to the present modification example can perform an amplification operation on the three amplifier elements in stages without increasing the sizes of the amplifier elements, it is possible to secure a large amount of back-off, and it is possible to increase the efficiency in a medium-output region. In addition, it is possible to reduce the size while increasing the efficiency in a low-output region as compared with the three-way Doherty-type amplifier circuit according to Comparative Example 2.

[1.9 Mounting Configuration of Amplifier Circuit 10 according to Exemplary Embodiment]

Figure 10:
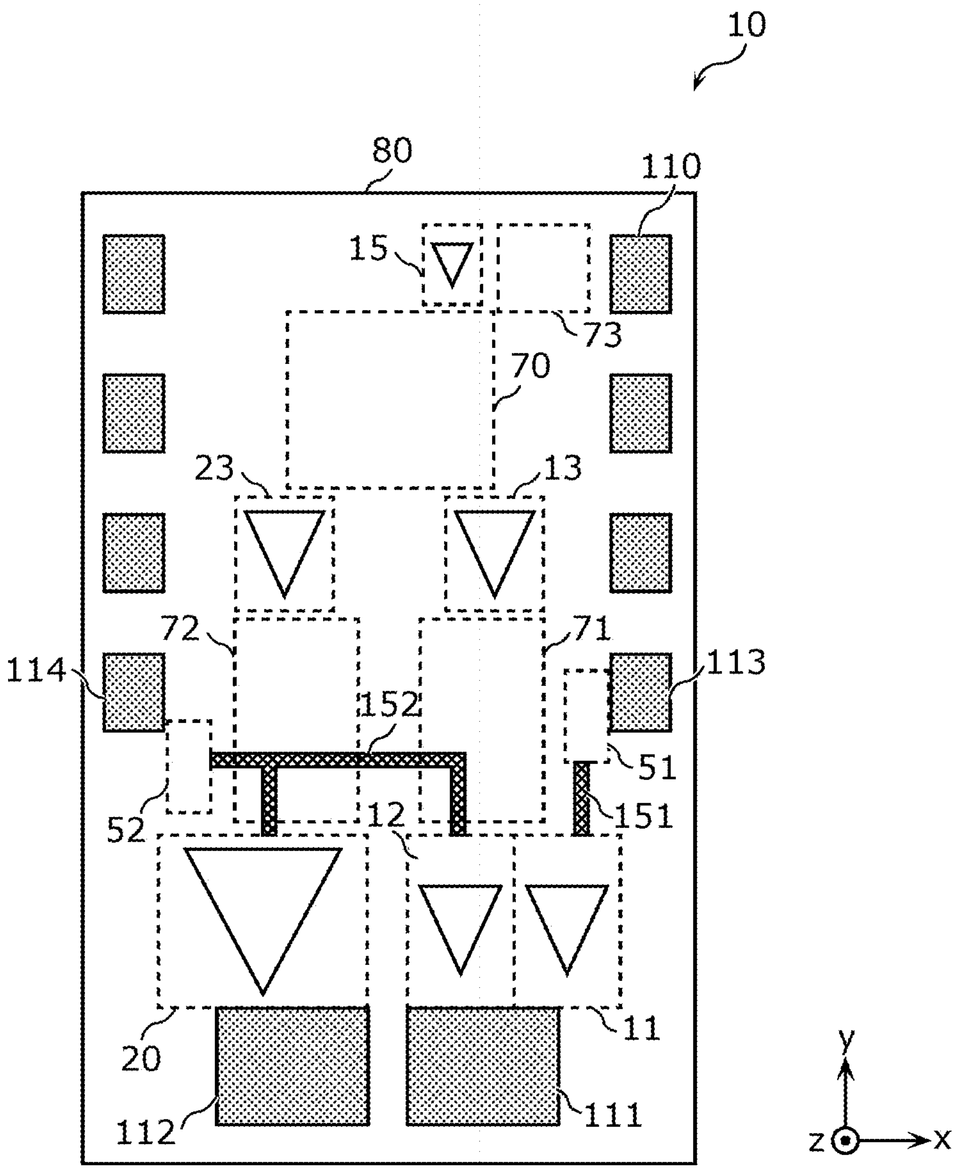
FIG. 10 is a plan view of the amplifier circuit according to the exemplary embodiment.

FIG. 10 is a plan view of the amplifier circuit 10 according to the exemplary embodiment. FIG. 10 shows the disposition of each circuit and each component in a case where the main surface of the semiconductor IC 80 provided in the amplifier circuit 10 is viewed in a plan view (perspective view).

In addition, in the amplifier circuit 10 shown in FIG. 10, preamplifiers 13, 15, and 23 and matching circuits 71, 72, and 73 are added as compared with the amplifier circuit 10 shown in FIG. 1. In addition, the signal input terminal 110 is a first input terminal and a second input terminal, and is disposed on a surface of the semiconductor IC 80, instead of the input terminals 110A and 110B.

As shown in FIG. 10, the carrier amplifier 11, the peak amplifiers 12, 20, the preamplifiers 13, 15, and 23, the bias circuits 51 and 52, and the matching circuits 71, 72, and 73 are included in the semiconductor IC 80.

The bias circuits 51 and 52 are not included in the semiconductor IC 80 and may be disposed outside the semiconductor IC 80.

In addition, the preamplifiers 13, 15, and 23, and the matching circuits 71, 72, and 73 do not need to be provided. In this case, the input terminal 110A connected to the input end of the carrier amplifier 11 and the input end of the peak amplifier 12, and the input terminal 110B connected to the input end of the peak amplifier 20 are disposed on the surface of the semiconductor IC 80.

In the amplifier circuit 10, the input end of the carrier amplifier 11 and the input end of the peak amplifier 12 are connected to the signal input terminal 110 (first input terminal) with the matching circuit 71, the preamplifier 13, the phase shifting circuit 70, the preamplifier 15, and the matching circuit 73 interposed therebetween. The output end of the carrier amplifier 11 and the output end of the peak amplifier 12 are connected to the output terminal 111. In addition, the input end of the peak amplifier 20 is connected to the signal input terminal 110 (second input terminal) with the matching circuit 72, the preamplifier 23, the phase shifting circuit 70, the preamplifier 15, and the matching circuit 73 interposed therebetween. In addition, the output end of the peak amplifier 20 is connected to the output terminal 112.

The bias circuit 51 is connected to the carrier amplifier 11 via a wiring 151. In addition, the bias circuit 52 is connected to the peak amplifiers 12 and 20 via a wiring 152.

In addition, on the surface of the semiconductor IC 80, the current input terminal 113 (first current input terminal) for the bias circuit 51 to receive the first constant current from the external constant current source and the current input terminal 114 (second current input terminal) for the bias circuit 52 to receive the second constant current from the external constant current source are disposed.

According to the above configuration, since the carrier amplifier 11, the peak amplifier 12, and the peak amplifier 20 are disposed in the semiconductor IC 80, the input terminals of the carrier amplifier 11 and the peak amplifier 12 can be made common, and the output terminals of the carrier amplifier 11 and the peak amplifier 12 can be made common, the semiconductor IC 80 can be reduced in size. In addition, since the bias circuits 51 and 52 can be built in the semiconductor IC 80, the amplifier circuit 10 can be reduced in size.

In a case where the main surface of the semiconductor IC 80 is viewed in a plan view, it is desirable that the total size of the amplifier transistor constituting the carrier amplifier 11 and the amplifier transistor constituting the peak amplifier 12 is equal to or smaller than the size of the amplifier transistor constituting the peak amplifier 20.

Accordingly, since the size ratio of the carrier amplifier 11 to the entire amplifier is small, it is possible to reduce the size while increasing the efficiency in a low-output region (region where only the carrier amplifier 11 performs an amplification operation).

[2. Effects and the Like]

As described above, the high-frequency module 1 according to the present exemplary embodiment includes the carrier amplifier 11, the peak amplifiers 12 and 20, the transformer 30 having the input-side coil 301 and the output-side coil 302, the phase shifting line 40, and the bias circuits 51 and 52 that supply a bias current, in which the carrier amplifier 11 and the peak amplifiers 12 and 20 are included in the semiconductor IC 80, the input terminals 110A and 110B for the semiconductor IC 80 to receive a high-frequency signal and the output terminals 111 and 112 for the semiconductor IC 80 to output the high-frequency signal are disposed on a surface of the semiconductor IC 80, the input end of the carrier amplifier 11 and the input end of the peak amplifier 12 are connected to the input terminal 110A, the output end of the carrier amplifier 11 and the output end of the peak amplifier 12 are connected to the output terminal 111, the input end of the peak amplifier 20 is connected to the input terminal 110B, the output end of the peak amplifier 20 is connected to the output terminal 112, one end of the input-side coil 301 is connected to the output terminal 111, one end of the phase shifting line 40 is connected to the output terminal 112, the other end of the phase shifting line 40 is connected to the other end of the input-side coil 301, the bias circuit 51 is connected to the carrier amplifier 11, and the bias circuit 52 is connected to the peak amplifiers 12 and 20.

Accordingly, as compared with a two-way Doherty-type amplifier circuit in the related art, since it is possible to perform an amplification operation on the three amplifier elements without increasing the sizes of the amplifier elements, it is possible to secure a large amount of back-off, and it is possible to increase the efficiency in a medium-output region. In addition, as compared with a three-way Doherty-type amplifier circuit in the related art, it is possible to reduce the size while increasing the efficiency in a low-output region. Therefore, it is possible to provide the high-frequency module 1 in which the amount of back-off and the efficiency are improved while an increase in size is suppressed.

In addition, the high-frequency module 1C according to Modification Example 3 includes the carrier amplifier 11, the peak amplifiers 12 and 20, the phase shifting line 41, and the bias circuits 51 and 52 that supply a bias current, in which the carrier amplifier 11 and the peak amplifiers 12 and 20 are included in the semiconductor IC 80, on a surface of the semiconductor IC 80, the input terminals 110A and 110B for the semiconductor IC 80 to receive a high-frequency signal and the output terminals 111 and 112 for the semiconductor IC 80 to output the high-frequency signal are disposed, the input end of the carrier amplifier 11 and the input end of the peak amplifier 12 are connected to the input terminal 110A, the output end of the carrier amplifier 11 and the output end of the peak amplifier 12 are connected to the output terminal 111, the input end of the peak amplifier 20 is connected to the input terminal 110B, the output end of the peak amplifier 20 is connected to the output terminal 112, one end of the phase shifting line 41 is connected to the output terminal 111, the other end of the phase shifting line 41 is connected to the output terminal 112, the bias circuit 51 is connected to the carrier amplifier 11, and the bias circuit 52 is connected to the peak amplifiers 12 and 20.

In addition, for example, in the high-frequency modules 1 and 1C, the first bias current supplied to the carrier amplifier 11 by the bias circuit 51 may be larger than the second bias current supplied to the peak amplifier 12 by the bias circuit 52, and may be larger than the third bias current supplied to the peak amplifier 20 by the bias circuit 52.

Accordingly, it is possible to operate the carrier amplifier 11 in the C-class and to operate the peak amplifiers 12 and 20 in the A-class or the AB-class.

In addition, for example, in the high-frequency modules 1 and 1C, in a case where the main surface of the semiconductor IC 80 is viewed in a plan view, the total size of the amplifier transistors constituting the carrier amplifier 11 and the amplifier transistors constituting the peak amplifier 12 may be equal to or smaller than the size of the amplifier transistors constituting the peak amplifier 20.

Accordingly, since the size ratio of the carrier amplifier 11 to the entire amplifier is small, it is possible to reduce the size while increasing the efficiency in a low-output region (region where only the carrier amplifier 11 performs an amplification operation).

In addition, for example, in the high-frequency module according to Modification Example 1, the bias circuit 52A may include transistors 565 and 566, the output end of the transistor 566 may be connected to the peak amplifier 12 via the wiring 92, and the output end of the transistor 565 may be connected to the peak amplifier 20 via the wiring 93.

Accordingly, since the second bias current and the third bias current are supplied from the transistors 566 and 565 different from each other, it is possible to make the magnitudes of the second bias current and the third bias current different from each other. In addition, since the second bias current and the third bias current are supplied to the peak amplifiers 12 and 20 by the wiring 92 and 93, respectively, the second bias current and the third bias current can be prevented from interfering with each other and becoming noise sources.

In addition, for example, in the high-frequency module according to Modification Example 2, the terminal 65*a*, the terminal 65*b*, and the terminal 65*c* may be included, the switch 65 that switches between the connection between the terminal 65*a* and the terminal 65*b* and the connection between the terminal 65*a* and the terminal 65*c* is further provided, the terminal 65*a* may be connected to the peak amplifier 12, the terminal 65*b* may be connected to the bias circuit 51, and the terminal 65*c* may be connected to the bias circuit 52.

Accordingly, it is possible to select and combine any one of the amplification characteristics of the carrier amplifier 11 or the amplification characteristics of the peak amplifier 20 with the amplification characteristics of the peak amplifier 12. Therefore, the amount of back-off can be adjusted.

In addition, for example, the high-frequency module according to Modification Example 2 may include the switch 65 in the semiconductor IC 80.

Accordingly, the amplifier circuit 10B can be reduced in size.

In addition, for example, in the high-frequency module 1, the bias circuits 51 and 52 may be included in the semiconductor IC 80, and the current input terminal 113 for the bias circuit 51 to receive the first constant current and the current input terminal 114 for the bias circuit 52 to receive the second constant current may be disposed on the surface of the semiconductor IC 80.

Accordingly, since the carrier amplifier 11, the peak amplifier 12, and the peak amplifier 20 are disposed in the semiconductor IC 80, the input terminals of the carrier amplifier 11 and the peak amplifier 12 can be made common to each other, and the output terminals of the carrier amplifier 11 and the peak amplifier 12 can be made common to each other, the semiconductor IC 80 can be reduced in size. In addition, since the bias circuits 51 and 52 can be built in the semiconductor IC 80, the amplifier circuit 10 and the high-frequency module 1 can be reduced in size.

Further, the communication device 4 according to the present exemplary embodiment includes the RFIC 3 that processes a high-frequency signal, and the high-frequency module 1 that transmits the high-frequency signal between the RFIC 3 and the antenna 2.

Accordingly, the effect of the high-frequency module 1 can be realized by the communication device 4.

Other Exemplary Embodiments and Like

The high-frequency module and the communication device according to the exemplary embodiment of the present disclosure have been described above with reference to the exemplary embodiment and the modification examples, but the high-frequency module and the communication device according to the present disclosure are not limited to the above-described exemplary embodiments and modification examples. The present disclosure also includes another exemplary embodiment realized by combining any constituent elements in the exemplary embodiment and the modification examples described above, a modification example obtained by making various modifications that can be conceived of by those skilled in the art with respect to the exemplary embodiment and the modification examples described above within a range that does not deviate from the gist of the present disclosure, or various devices with the built-in high-frequency module and communication device.

Further, for example, in the high-frequency module and communication device according to the above exemplary embodiments, examples, and modification examples, another circuit element, wiring, or the like may be inserted between the paths that connect the circuit elements and the signal paths shown in the drawings.

INDUSTRIAL APPLICABILITY

The present disclosure can be widely used in a communication device, such as a mobile phone as a high-frequency circuit disposed in a front end portion supporting multiband.

REFERENCE SIGNS LIST

1, 1C high-frequency module
2 antenna
3 RF signal processing circuit (RFIC)
4 communication device
10, 10A, 10B, 10C, 510, 520 amplifier circuit
11, 511 carrier amplifier
12, 20, 512, 513 peak amplifier
13, 15, 23 preamplifier
30 transformer
40, 41, 541, 542, 543, 544, 545 phase shifting line
51, 52, 52A bias circuit
61, 64, 65 switch
62, 63 filter
65*a*, 65*b*, 65*c* terminal
70, 570 phase shifting circuit
71, 72, 73 matching circuit
80 semiconductor IC
91, 92, 93, 151, 152 wiring
100 antenna connection terminal
110 signal input terminal
110A, 110B input terminal
111, 112 output terminal
113, 114 current input terminal
120 signal output terminal
301 input-side coil
302 output-side coil
551, 561 resistance element
552, 562 capacitor
553, 554, 555, 563, 564, 565, 566 transistor

The invention claimed is:

1. A high-frequency module comprising:
a first amplifier element, a second amplifier element, and a third amplifier element;
a transformer that includes an input-side coil and an output-side coil;
a phase shifting circuit; and
a first bias circuit and a second bias circuit that supply a bias current, wherein
the first amplifier element, the second amplifier element, and the third amplifier element are included in a semiconductor integrated circuit component,
a first input terminal and a second input terminal for the semiconductor integrated circuit component to receive a high-frequency signal, and a first output terminal and a second output terminal for the semiconductor integrated circuit component to output the high-frequency signal are disposed on a surface of the semiconductor integrated circuit component,
an input end of the first amplifier element and an input end of the second amplifier element are connected to the first input terminal,
an output end of the first amplifier element and an output end of the second amplifier element are connected to the first output terminal,
an input end of the third amplifier element is connected to the second input terminal,
an output end of the third amplifier element is connected to the second output terminal,
one end of the input-side coil is connected to the first output terminal,
one end of the phase shifting circuit is connected to the second output terminal,
another end of the phase shifting circuit is connected to another end of the input-side coil,
the first bias circuit is connected to the first amplifier element, and
the second bias circuit is connected to the second amplifier element and the third amplifier element.

2. The high-frequency module of claim 1, wherein
a first bias current supplied to the first amplifier element by the first bias circuit is larger than a second bias current supplied to the second amplifier element by the second bias circuit and is larger than a third bias current supplied to the third amplifier element by the second bias circuit.

3. The high-frequency module of claim 1, wherein
in a case where a main surface of the semiconductor integrated circuit component is viewed in a plan view, a total size of an amplifier transistor constituting the first amplifier element and an amplifier transistor constituting the second amplifier element is equal to or smaller than a size of an amplifier transistor constituting the third amplifier element.

4. The high-frequency module of claim 1, wherein
the second bias circuit includes a first transistor and a second transistor,
an output end of the first transistor is connected to the second amplifier element via a first wiring, and
an output end of the second transistor is connected to the third amplifier element via a second wiring.

5. The high-frequency module of claim 1, further comprising:
a switch that has a first terminal, a second terminal, and a third terminal and switches between connection between the first terminal and the second terminal and connection between the first terminal and the third terminal, wherein
the first terminal is connected to the second amplifier element,
the second terminal is connected to the first bias circuit, and
the third terminal is connected to the second bias circuit.

6. The high-frequency module of claim 5, wherein
the switch is included in the semiconductor integrated circuit component.

7. The high-frequency module of claim 6, wherein
the first bias circuit and the second bias circuit are included in the semiconductor integrated circuit component, and
on the surface of the semiconductor integrated circuit component, a first current input terminal for the first bias circuit to receive a first constant current and a second current input terminal for the second bias circuit to receive a second constant current are disposed.

8. The high-frequency module of claim 1, further comprising:

a first switch including a first switch input terminal, a first switch output terminal and a second switch output terminal;

a second switch including a second switch input terminal and a second switch output terminal;

a first filter; and a second filter, wherein the first switch input terminal is connected to the output-side coil, the first filter is connected to the first switch output terminal, the second filter is connected to the second switch output terminal, and the second switch is connected to the first filter and second filter.

9. The high-frequency module of claim 8, further comprising:

a reception filter, wherein the reception filter, the first filter and the second filter configure a duplexer.

10. A high-frequency module comprising:

a first amplifier element, a second amplifier element, and a third amplifier element;

a phase shifting circuit; and a first bias circuit and a second bias circuit that supply a bias current, wherein the first amplifier element, the second amplifier element, and the third amplifier element are included in a semiconductor integrated circuit component, a first input terminal and a second input terminal for the semiconductor integrated circuit component to receive a high-frequency signal, and a first output terminal and a second output terminal for the semiconductor integrated circuit component to output the high-frequency signal are disposed on a surface of the semiconductor integrated circuit component, an input end of the first amplifier element and an input end of the second amplifier element are connected to the first input terminal, an output end of the first amplifier element and an output end of the second amplifier element are connected to the first output terminal, an input end of the third amplifier element is connected to the second input terminal, an output end of the third amplifier element is connected to the second output terminal, one end of the phase shifting circuit is connected to the first output terminal, another end of the phase shifting circuit is connected to the second output terminal, the first bias circuit is connected to the first amplifier element, and the second bias circuit is connected to the second amplifier element and the third amplifier element.

11. The high-frequency module of claim 10, wherein a first bias current supplied to the first amplifier element by the first bias circuit is larger than a second bias current supplied to the second amplifier element by the second bias circuit and is larger than a third bias current supplied to the third amplifier element by the second bias circuit.

12. The high-frequency module of claim 10, wherein in a case where a main surface of the semiconductor integrated circuit component is viewed in a plan view, a total size of an amplifier transistor constituting the first amplifier element and an amplifier transistor constituting the second amplifier element is equal to or smaller than a size of an amplifier transistor constituting the third amplifier element.

13. The high-frequency module of claim 10, wherein the second bias circuit includes a first transistor and a second transistor, an output end of the first transistor is connected to the second amplifier element via a first wiring, and an output end of the second transistor is connected to the third amplifier element via a second wiring.

14. The high-frequency module of claim 10, further comprising:

a switch that has a first terminal, a second terminal, and a third terminal and switches between connection between the first terminal and the second terminal and connection between the first terminal and the third terminal, wherein the first terminal is connected to the second amplifier element, the second terminal is connected to the first bias circuit, and the third terminal is connected to the second bias circuit.

15. The high-frequency module of claim 14, wherein the switch is included in the semiconductor integrated circuit component.

16. The high-frequency module of claim 14, wherein the first bias circuit and the second bias circuit are included in the semiconductor integrated circuit component, and a first current input terminal for the first bias circuit to receive a first constant current and a second current input terminal for the second bias circuit to receive a second constant current are disposed on the surface of the semiconductor integrated circuit component.

17. The high-frequency module of claim 10, further comprising:

a first switch including a first switch input terminal, a first switch output terminal and a second switch output terminal;

a second switch including a second switch input terminal and a second switch output terminal;

a first filter; and a second filter, wherein the first switch input terminal is connected to the output-side coil, the first filter is connected to the first switch output terminal, the second filter is connected to the second switch output terminal, and the second switch is connected to the first filter and second filter.

18. The high-frequency module of claim 17, further comprising:

a reception filter, wherein the reception filter, the first filter and the second filter configure a duplexer.

19. A communication device comprising:

a signal processing circuit that processes a high-frequency signal;

an antenna; and a high-frequency module including a first amplifier element, a second amplifier element, and a third amplifier element;

a transformer that includes an input-side coil and an output-side coil;

a phase shifting circuit; and a first bias circuit and a second bias circuit that supply a bias current, wherein the first amplifier element, the second amplifier element, and the third amplifier element are included in a semiconductor integrated circuit component, a first input terminal and a second input terminal for the semiconductor integrated circuit component to receive a high-frequency signal, and a first output terminal and a second output terminal for the semiconductor integrated circuit component to output the high-frequency signal are disposed on a surface of the semiconductor integrated circuit component, an input end of the first amplifier element and an input end of the second amplifier element are connected to the first input terminal, an output end of the first amplifier element and an output end of the second amplifier element are connected to the first output terminal, an input end of the third amplifier element is connected to the second input terminal, an output end of the third amplifier element is connected to the second output terminal, one end of the input-side coil is connected to the first output terminal, one end of the phase shifting circuit is connected to the second output terminal, another end of the phase shifting circuit is connected to another end of the input-side coil, the first bias circuit is connected to the first amplifier element, and the second bias circuit is connected to the second amplifier element and the third amplifier element.

20. The communication device of claim 19, further comprising:

a reception filter; and a low noise amplifier.

* * * * *